(12) United States Patent
Hirano et al.

(10) Patent No.: US 11,217,604 B2
(45) Date of Patent: Jan. 4, 2022

(54) SEMICONDUCTOR DEVICE

(71) Applicant: Tower Partners Semiconductor Co., Ltd., Toyama (JP)

(72) Inventors: Hiroshige Hirano, Nara (JP); Hiroaki Kuriyama, Toyama (JP); Takayuki Yamada, Toyama (JP); Kenji Tateiwa, Osaka (JP)

(73) Assignee: Tower Partners Semiconductor Co., Ltd., Toyama (JP)

( * ) Notice: Subject to any disclaimer, the term of this patent is extended or adjusted under 35 U.S.C. 154(b) by 0 days.

(21) Appl. No.: 16/785,035

(22) Filed: Feb. 7, 2020

(65) Prior Publication Data
US 2020/0176476 A1 Jun. 4, 2020

Related U.S. Application Data

(63) Continuation of application No. PCT/JP2018/028741, filed on Jul. 31, 2018.

(30) Foreign Application Priority Data

Aug. 7, 2017 (JP) .............................. JP2017-152333
Oct. 25, 2017 (JP) .............................. JP2017-206510

(51) Int. Cl.
*H01L 27/12* (2006.01)
*H01L 29/08* (2006.01)
(Continued)

(52) U.S. Cl.
CPC ...... *H01L 27/1203* (2013.01); *H01L 29/0847* (2013.01); *H01L 29/41725* (2013.01); *H01L 29/42364* (2013.01)

(58) Field of Classification Search
CPC .......... H01L 27/1203; H01L 29/78645; H01L 29/78615; H01L 2924/00; H01L 29/41733;
(Continued)

(56) References Cited

U.S. PATENT DOCUMENTS 5,808,341 A 9/1998 Maeda et al.
6,310,377 B1 10/2001 Maeda et al.
(Continued)

FOREIGN PATENT DOCUMENTS

CN 101369605 A 2/2009
DE 19705004 A1 12/1997
(Continued)

OTHER PUBLICATIONS

International Search Report for PCT Application No. PCT/JP2018/028741, dated Oct. 23, 2018 in 4 pages.

*Primary Examiner* — Jonathan Han
(74) *Attorney, Agent, or Firm* — Knobbe, Martens, Olson & Bear, LLP

(57) ABSTRACT

An active region includes a body region in which first and second transistors are formed, a connection portion to which a potential of the body region is connected, and a lead portion that connects the body region and the connection portion. Source regions or drain regions of the first and second transistors formed in the body region are provided in a common region. Each of the lead portions extends from a corresponding channel region such that the lead portions are isolated from each other, and a gate electrode extends thereon. A width of the lead portion is narrower than a distance between corresponding ones of contact portions of the source regions and the drain regions of the first and second transistors. A width of the connection portion is equal
(Continued)

to or narrower than a gate width of the gate electrode extending on the lead portion.

16 Claims, 34 Drawing Sheets

(51) Int. Cl.
    *H01L 29/417*     (2006.01)
    *H01L 29/423*     (2006.01)

(58) Field of Classification Search
    CPC ............ H01L 29/42384; H01L 29/458; H01L 29/0847; H01L 29/41725; H01L 29/42364; H01L 21/84; H01L 21/8234; H01L 21/8238; H01L 27/088; H01L 27/092; H01L 29/78; H01L 29/786; H01L 21/823475; H01L 21/823871; H01L 21/823412; H01L 21/823807; H01L 21/823437; H01L 21/823828
    See application file for complete search history.

(56) References Cited

U.S. PATENT DOCUMENTS

| | | | |
|---|---|---|---|
| 8,274,841 B2* | 9/2012 | Shimano | G11C 11/405 365/189.011 |
| 8,582,359 B2* | 11/2013 | Widjaja | H01L 27/10802 365/185.05 |
| 9,905,564 B2* | 2/2018 | Widjaja | G11C 11/404 |
| 2001/0035774 A1 | 11/2001 | Kotani | |
| 2002/0020878 A1 | 2/2002 | Kawanaka | |
| 2002/0048972 A1 | 4/2002 | Yamaguchi et al. | |
| 2003/0132464 A1 | 7/2003 | Yamaguchi et al. | |
| 2007/0241365 A1 | 10/2007 | Iwamatsu | |
| 2007/0241401 A1* | 10/2007 | Tsujiuchi | H01L 29/66772 257/347 |
| 2008/0137394 A1* | 6/2008 | Shimano | H01L 27/108 365/72 |
| 2009/0073149 A1 | 3/2009 | Matsumoto et al. | |
| 2009/0174000 A1 | 7/2009 | Ohguro | |
| 2011/0294445 A1 | 12/2011 | Goto et al. | |

FOREIGN PATENT DOCUMENTS

| | | |
|---|---|---|
| EP | 1 353 386 A2 | 10/2003 |
| JP | 61-53777 A | 3/1986 |
| JP | H09-252130 A | 9/1997 |
| JP | 2002-16260 A | 1/2002 |
| JP | 2002-134755 A | 5/2002 |
| JP | 2007-287720 A | 11/2007 |
| JP | 2007-287747 A | 11/2007 |
| JP | 2009-49041 A | 3/2009 |
| JP | 2009-158711 A | 7/2009 |
| JP | 2011-243843 A | 12/2011 |
| JP | 2011-249466 A | 12/2011 |
| WO | 2011/145155 A1 | 11/2011 |

* cited by examiner

SEMICONDUCTOR DEVICE

CROSS-REFERENCE TO RELATED APPLICATIONS

This is a continuation of International Application No. PCT/JP2018/028741 filed on Jul. 31, 2018, which claims priority to Japanese Patent Application No. 2017-152333 filed on Aug. 7, 2017 and Japanese Patent Application No. 2017-206510 filed on Oct. 25, 2017. The entire disclosures of these applications are incorporated by reference herein.

BACKGROUND

In recent years, since performance of semiconductor integrated circuits has been improved and power consumption of semiconductor integrated circuits has been reduced, it has been examined to use a silicon-on-insulator (SOI) substrate. An SOI substrate is a substrate in which a thin semiconductor layer is formed on an insulation layer, and complete isolation between elements is enabled by forming an element isolation film that reaches the insulation layer. Moreover, a junction leakage current or a junction capacitance can be largely reduced by forming an impurity diffusion layer in a region that extends to the insulation layer. Therefore, SOI substrates are suitable for semiconductor devices that are required to operate at high speed operation.

On the other hand, in a MOSFET using an SOI layer, a potential of a body region is in a floating state, and therefore, change in the potential of the body region influences an operation of the MOSFET. Fluctuations of the body potential (a floating body effect) cause variations of element characteristics and makes margin design of circuits difficult. Various measures have been considered to cope with the floating body effect, and a method in which an electrode is provided in the body region to fix a potential is a most reliable measure and has been commonly used.

As a method for forming a contact in the body region, a method in which a region (a body contact region) of a conductivity type reverse to a conductivity type of source/drain regions of the MOSFET is provided in the same element region in which the MOSFET is formed and a boundary therebetween is covered by a gate electrode formed into a T-shape, an L-shape, or an H-shape to isolate the element region and the body contact portion from each other is described in Japanese Unexamined Patent Publication No. 2002-134755 (Patent Document 1).

FIG. 45 is a diagram illustrating a configuration called T-shaped configuration described in Patent Document 1. In the configuration illustrated in FIG. 45, one element region 100 is divided into a source region 102, a drain region 104, and a body contact region 106 by a T-shaped gate electrode 108 such that the source region 102, the drain region 104, and the body contact region 106 are isolated from each other. The element region (a body region: a region of a channel portion of a transistor) under the gate electrode 108 is formed of a semiconductor layer of the same conductive type as a conductive type of the body contact region 106 and is electrically connected to the body contact region 106.

In the semiconductor device described in Patent Document 1, the gate electrode 108 extends to isolate the source region 102 or the drain region 104 from the body contact region 106 in consideration of salicide (self aligned silicide) process. That is, when the salicide process is employed, in a region in which the gate electrode 108 and a sidewall insulation film formed on side walls of the gate electrode 108 are not provided, an upper surface of the element region 100 is covered by a silicide film. Therefore, unless the gate electrode 108 is formed so as to isolate the source region 102 or the drain region 104 from the body contact region 106, these regions are electrically connected to each other via the silicide film. As described above, the body contact region can be isolated from the source region or the drain region by providing the gate electrode extending in the above described manner.

In the semiconductor device described in Patent Document 1, each of a width $W_1$ of the connection portion with the body contact region 106 and a width $W_2$ of the body contact region 106 is larger than a distance L between contact portions of a source and a drain of the transistor, and furthermore, a width $W_3$ of a gate portion 108b that isolates the body contact region 106 from the source and the drain is larger than the widths $W_1$ and $W_2$.

FIG. 46 is a view illustrating a case in which a three-input NAND circuit is laid out using a transistor with the T-shaped gate illustrated in FIG. 45, which is not described in Patent Document 1. Three transistors in an upper portion are P-channel transistors and three transistors in a lower portion are P-channel transistors. In this case, a lateral portion 108b of a T-shaped gate electrode that isolates the body contact region 106 protrudes from an active region of the corresponding transistor. Therefore, it is needed to ensure an adjacent one of the transistors next thereto to be isolated from the gate portion 108b, and the gate portion 108b limits a layout area.

As another method for forming a contact in a body region, a semiconductor device having a configuration in which a body contact region is led out from a body region of a transistor is described in Japanese Unexamined Patent Publication No. H09-252130 (Patent Document 2).

FIG. 47 is a view illustrating the semiconductor device descried in Patent Document 2 in which a body contact region 203 is connected to a body region 201 of a transistor via a lead portion 202. In the semiconductor device illustrated in FIG. 47, a width $W_2$ of a gate 206 that isolates the body contact region 203 from a source 204 and a drain 205 is smaller than a distance L between contact portions of the source 204 and the drain 205 and is three times wider than a width $W_1$ of the lead portion 202 or more. A width $W_3$ of the body contact region 203 is about the same as the width $W_2$ of the gate 206.

In a circuit used for a switch circuit or the like, a configuration in which transistors are connected in series in order to increase its breakdown voltage is used. An example of the configuration is described in Japanese Unexamined Patent Publication No. 2011-249466 (Patent Document 3). A circuit configuration is illustrated in FIG. 6 of Patent Document 3 and, as illustrated in FIG. 19 of Patent Document 3, a layout configuration in which respective sources and drains of transistors connected in series are connected via interconnects and which is not formed of one active region is employed.

SUMMARY

In the semiconductor device described in Patent Document 1, the gate electrode extends also on the gate electrode 108b that isolates the body contact region 106 from the source region 102 or the drain region 104 via the gate insulation film, and therefore, a capacitance of a MOSFET, such as a capacitance of this region with a body portion via the gate insulation film, capacitances of a contact and an interconnect which are connected to the source or the drain via the sidewalls at sides of the gate, or the like, is increased.

Therefore, in the semiconductor device including the body contact region 106, an extra gate capacitance or junction capacitance is increased, and an effect of reduction in parasitic capacitance which is an advantage of use of the SOI substrate cannot be sufficiently achieved.

One end of a gate length of the MOSFET is defined by the gate electrode 108 and the other end of the gate length of the MOSFET is defined by the element region 100. Therefore, there is a problem in which, in a lithography step performed in forming the gate electrode 108, when a position of the gate electrode 108 relative to the element region 100 is displaced, the gate length fluctuates.

There is also a problem in which, as illustrated in FIG. 46, when a plurality of transistors each including a T-shaped gate are arranged to form a logic circuit, an arrangement pitch is limited by the length of the lateral portion 108b of the T-shaped gate, and therefore, a layout area is increased.

In the semiconductor device described in Patent Document 2, the width $W_2$ of the lead portion 202 that connects a body region 201 of the transistor and the body contact region 203 to each other is narrow, and therefore, a capacitance of a lead portion via the gate insulation film is smaller than that of the T-shaped gate described in Patent Document 1. However, the width $W_1$ of the gate 206 that isolates the body contact region 203 from the source 204 and the drain 205 is three or more times wider than the width $W_2$ of the lead portion 202, and therefore, a capacitance between the gate region and the body contact region or a wafer substrate is increased. Therefore, there is a problem in which the effect of reduction in parasitic capacitance which is an advantage of use of the SOI substrate cannot be sufficiently achieved.

In the present disclosure, a semiconductor device which includes a connection portion (a body contact) to which a potential of a body region in which a transistor is formed is connected and in which a gate capacitance can be reduced and deterioration of speed performance of the transistor can be suppressed will be described.

A semiconductor device according to the present disclosure is a semiconductor device including a first transistor and a second transistor formed in a same active region defined by an element isolation region, and the active region includes a body region in which the first transistor and the second transistor are formed, a connection portion to which a potential of the body region is connected, and a lead portion that connects the body region and the connection portion.

Each of the first transistor and the second transistor formed in the body region includes a channel region, a gate electrode formed on the channel region via a gate insulation film, and a source region and a drain region formed with the channel region interposed therebetween, and the source regions or the drain regions of the first transistor and the second transistor are formed in a common region and have a same potential.

Each of the lead portions extends from a corresponding one of the channel regions of the first transistor and the second transistor in a direction perpendicular to a channel direction such that the lead portions are isolated from each other, and each of the gate electrodes extends on a corresponding one of the lead portions, a width of each of the lead portions is narrower than a distance between corresponding ones of contact portions of the source regions and the drain regions of the first transistor and the second transistor, and a width of each of the connection portions is equal to or narrower than a width of a corresponding one of the gate electrodes extending on the lead portions.

According to the present disclosure, a semiconductor device which includes a body contact and in which a gate capacitance can be reduced and deterioration of speed performance of the transistor can be suppressed can be provided.

DETAILED DESCRIPTION

Embodiments of the present disclosure will be described in detail below with reference to the accompanying drawings. Note that the technology disclosed herein is not limited to the embodiments below. The embodiments of the present disclosure can be appropriately modified without departing from the scope of the present disclosure in which advantageous effects of the present disclosure can be achieved.

First Embodiment

Figure 1:
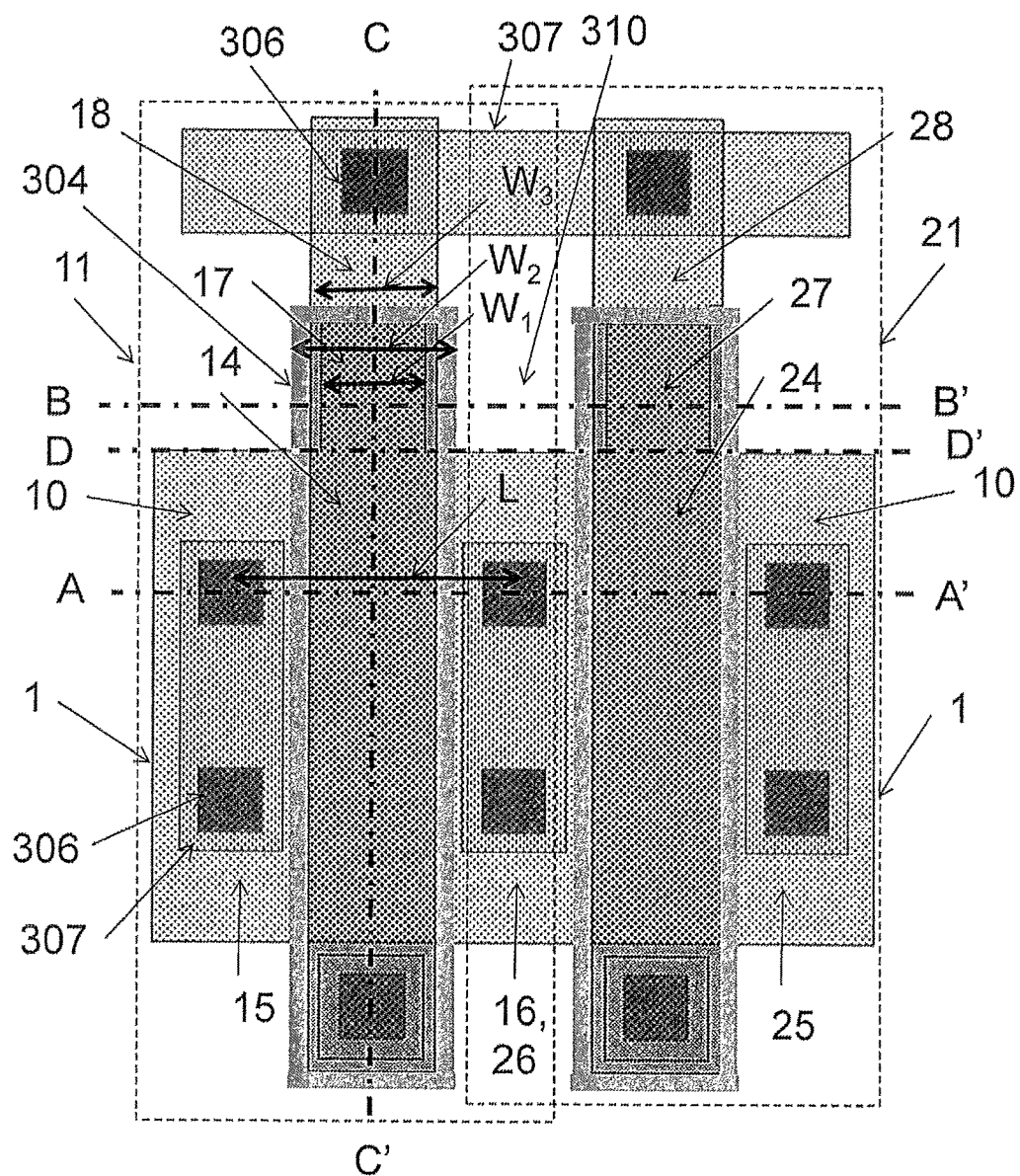
FIG. 1 is a plan view schematically illustrating a configuration of a semiconductor device according to a first embodiment of the present disclosure.
Figure 2:
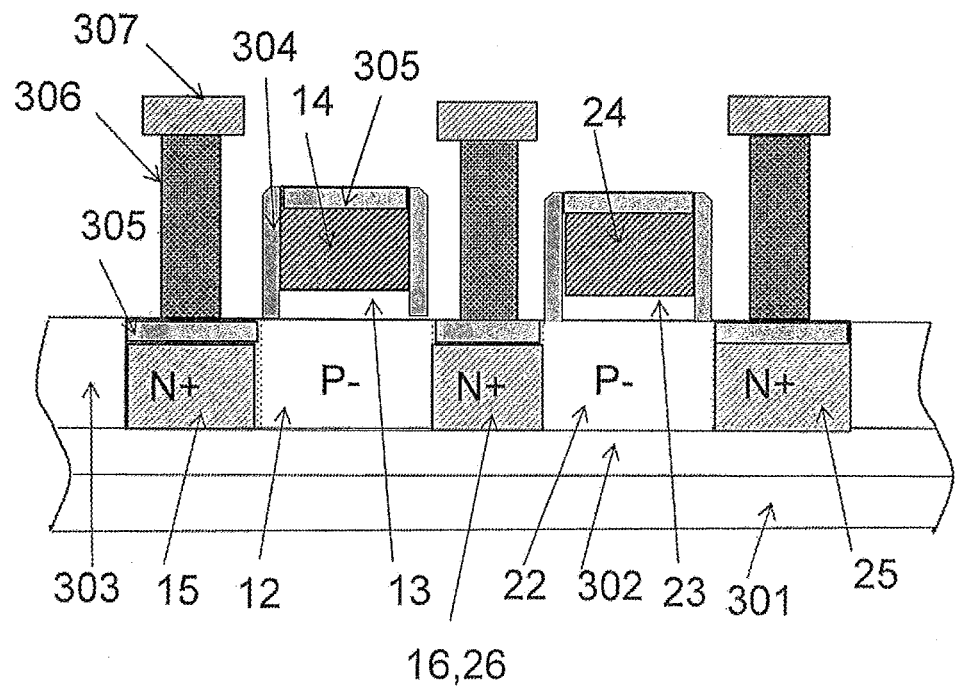
FIG. 2 is a cross-sectional view taken along the line A-A' of FIG. 1.
Figure 3:
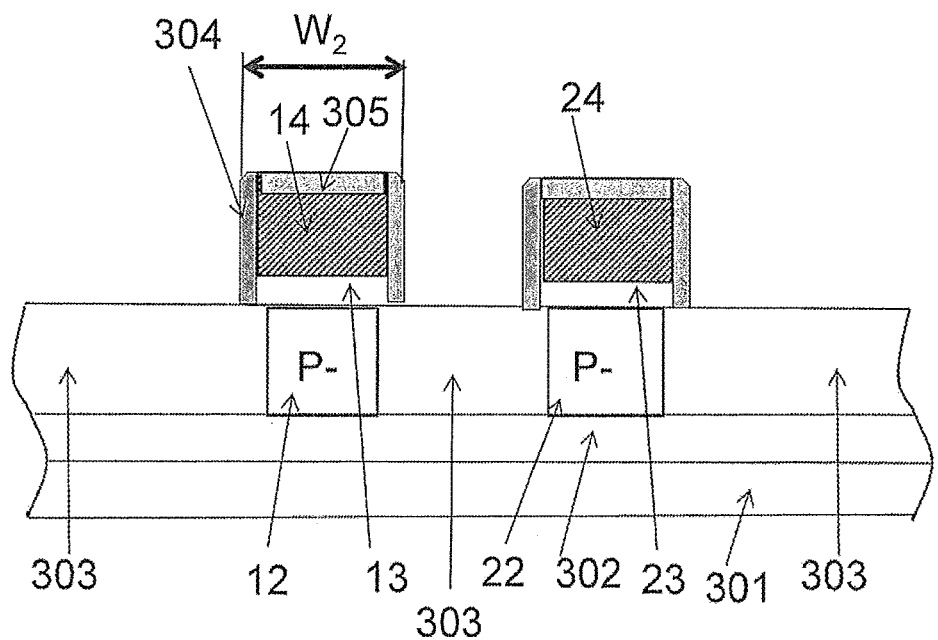
FIG. 3 is a cross-sectional view taken along the line B-B' of FIG. 1.
Figure 4:
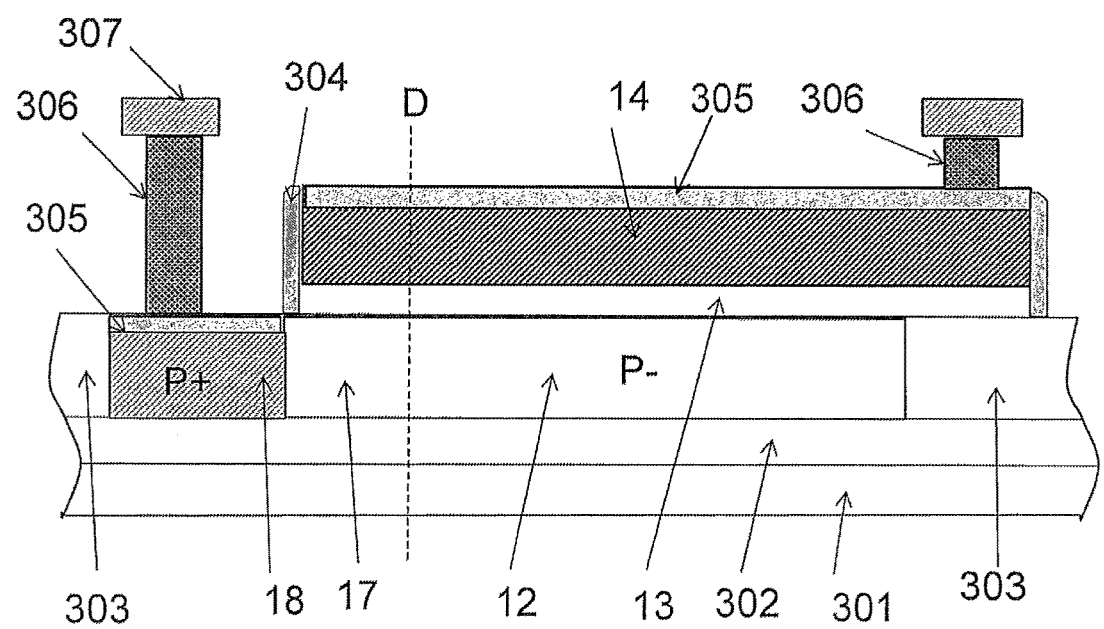
FIG. 4 is a cross-sectional view taken along the line C-C' of FIG. 1.

FIG. 1 to FIG. 4 are views schematically illustrating a configuration of a semiconductor device according to a first embodiment of the present disclosure. FIG. 1 is a plan view. FIG. 2, FIG. 3, and FIG. 4 are cross-sectional views taken along the line A-A', the line B-B', and the line C-C' of FIG. 1, respectively. Note that this embodiment will be described using an example in which an SOI substrate is used, but the present disclosure is not limited to this embodiment.

In the semiconductor device in this embodiment, a first transistor 11 and a second transistor 21 are formed in the same active region 1 defined by an element isolation film 303. The active region 1 includes a body region 10 in which the first transistor 11 and the second transistor 21 are formed, connections portions 18 and 28 to which a potential of the body region 10 is connected, and lead portions 17 and 27 that connect the body region 10 and the connection portions 18 and 28.

Each of the first transistor 11 and the second transistor 21 formed in the body region 10 includes a corresponding one of channel regions 12 and 22, a corresponding one of gate electrodes 14 and 24 which is formed on the corresponding one of the channel regions 12 and 22 via a corresponding one of gate insulation films 13 and 23, and a corresponding one of source regions 15 and 25 and a corresponding one of drain regions 16 and 26 with a corresponding one of the channel regions 12 and 22 interposed therebetween. The drain regions 16 and 26 of the first transistor 11 and the second transistor 21 are formed in a common region and have the same potential. Note that, in this embodiment, an $N^+$ diffusion layer that forms the drain regions 16 and 26 is made common. In this embodiment, the drain regions 16 and 26 are formed in the common region, but the source regions 15 and 25 may be formed in a common region.

Each of the lead portions 17 and 27 extends from a corresponding one of the channel regions 12 and 22 of the first transistor 11 and the second transistor 21 in a direction perpendicular to a channel direction so as to be isolated from each other. Each of the gate electrodes 14 and 24 extends on a corresponding one of the lead portions 17 and 27.

In this embodiment, a width $W_1$ of each of the lead portions 17 and 27 is narrower than a distance L between corresponding ones of contact portions 306 of the source regions 15 and 25 and the drain regions 16 and 26 of the first transistor 11 and the second transistor 21. A width $W_3$ of each of the connection portions 18 and 28 is equal to or narrower than a gate width $W_2$ of a corresponding one of the gate electrodes 14 and 24 that extend on the lead portions 17 and 27, respectively. Note that, as in this embodiment, when a sidewall insulation film 304 is formed on side surfaces of the gate electrodes 14 and 24, the gate width $W_2$ of each of the gate electrodes 14 and 24 means a width including the sidewall insulation film 304.

With reference to FIG. 1 to FIG. 4, a specific configuration of the semiconductor device in this embodiment will be described in detail below.

The SOI substrate includes an insulation layer 302 formed of a silicon oxide film formed on a silicon substrate 301 and an SOI layer formed of a single-crystal silicon layer formed on the insulation layer 302. In the SOI layer, an element isolation film 303 that defines the active region 1 is formed. The gate electrodes 14 and 24 are formed on the active region 1 via the gate insulation films 13 and 23, respectively.

The first transistor 11 and the second transistor 21 are formed of transistors of the same channel type. In this embodiment, an example in which N-channel transistors are used is described, but the first transistor 11 and the second transistor 21 may be formed of P-channel transistors.

The channel regions 12 and 22 of the first transistor 11 and the second transistor 21 are formed of a P⁻ diffusion layer, and the source regions 15 and 25 and the drain regions 16 and 26 are formed of an N⁺ diffusion layer. Note that the N⁺ diffusion layer preferably reaches the insulation layer 302. The lead portions 17 and 27 are formed of a P⁻ diffusion layer, and the connection portions 18 and 28 are formed of a P⁺ diffusion layer. The connection portions 18 and 28 are connected to each other by an interconnect layer 307 via the contact portions 306.

The element isolation film 303 is preferably formed using a so-called shallow trench isolation (STI) method in which, after a shallow trench is formed, an insulation film is buried in the trench.

In this embodiment, the width $W_1$ of each of the lead portions 17 and 27 is equal to or narrower than the distance L between corresponding ones of the contact portions 306 of the source regions 15 and 25 and the drain regions 16 and 26 of the transistors 11 and 21, and thus, a configuration in which the gate capacitance has been reduced as compared to a known configuration is achieved.

It is sufficient that the gate width $W_2$ of each of the gate electrodes 14 and 24 on the lead portions 17 and 27 is a width enlarged in accordance with a width of mask displacement with respect to a corresponding one of the lead portions 17 and 27, and therefore, the gate width $W_2$ is equal to or narrower than the width enlarged by an amount corresponding to the width of mask displacement. Herein, the width of mask displacement can be equal to or narrower than ½ of a minimum processing dimension. For example, assuming that the minimum processing dimension is the width $W_1$ of the lead portions 17 and 27, when the width $W_1$ is 200 nm, the width of mask displacement can be made 100 nm or narrower.

As described above, the gate width $W_2$ of the gate electrodes 14 and 24 on the lead portions 17 and 27 is made as narrow as possible, and thus, a capacitance of the gate between the gate and the silicon substrate 301 or the like can be reduced.

In consideration of a case in which an arrangement pitch of the first transistor 11 and the second transistor 21 is limited by an isolation width for the gate electrodes 14 and 24 on the lead portions 17 and 27, the layout area is set minimum, and therefore, the width $W_3$ of the connection portions 18 and 28 is equal to or narrower than the gate width $W_2$ of the gate electrodes 14 and 24 on the lead portions 17 and 27. Thus, the arrangement pitch of the first transistor 11 and the second transistor 21 can be made minimum. Moreover, the width $W_3$ of the connection portions 18 and 28 is set narrow, and therefore, a capacitance with the corresponding gate can be set small.

According to this embodiment, the gate capacitance can be reduced, and also, the arrangement pitch of the transistors can be reduced, so that the layout area can be reduced. Thus, a semiconductor device in which deterioration of speed performance of the transistors can be suppressed can be provided.

Note that, in the example of FIG. 1, for the entire lead portions 17 and 27, the width $W_1$ is equal to or narrower than the gate width $W_2$ of the gate electrodes 14 and 24.

Herein, each of the connection portion 18 and the connection portion 28 extends to an upper portion and is connected to the interconnect layer 307 via the corresponding contact portion 306. That is, the connection portion 18 and the connection portion 28 are connected to each other via the interconnect layer 307.

In contrast, the connection portion 18 and the connection portion 28 may be directly connected to each other via an active region. The reference sign 310 denotes a non-active region and, in fabrication steps of fabricating a semiconductor device, the non-active region needs to have a certain area for convenience of processing. Therefore, the connection portions having the width $W_3$ are arranged with a certain distance therebetween in many cases. The connection portion 18 and the connection portion 28 can be directly connected via an active region with a certain distance between the connection portion 18 and the connection portion 28.

First Modified Example of First Embodiment

Figure 5:
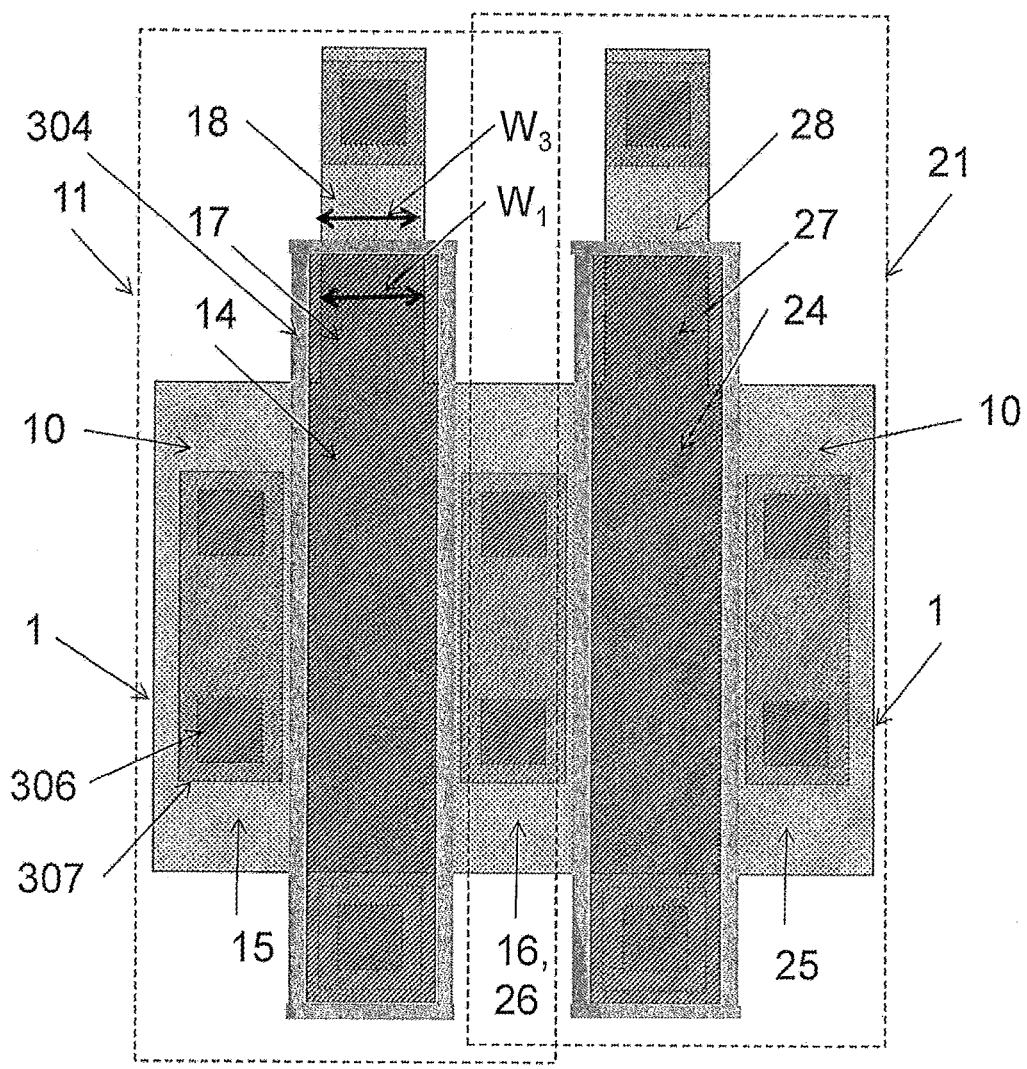
FIG. 5 is a plan view illustrating a configuration of a semiconductor device according to a first modified example of the first embodiment.

FIG. 5 is a plan view schematically illustrating a configuration of a semiconductor device according to a first modified example of the first embodiment.

In the first embodiment, the width $W_3$ of the connection portions 18 and 28 is wider than the width $W_1$ of the lead portions 17 and 27. In the first modified example, the width $W_3$ of the connection portions 18 and 28 is the same as the width $W_1$ of the lead portions 17 and 27. Thus, the layout can be simplified, and therefore, stable processability can be achieved. Furthermore, a configuration in which the gate capacity has been further reduced is employed, and therefore, further increase in operation speed can be achieved.

Second Modified Example of First Embodiment

Figure 6:
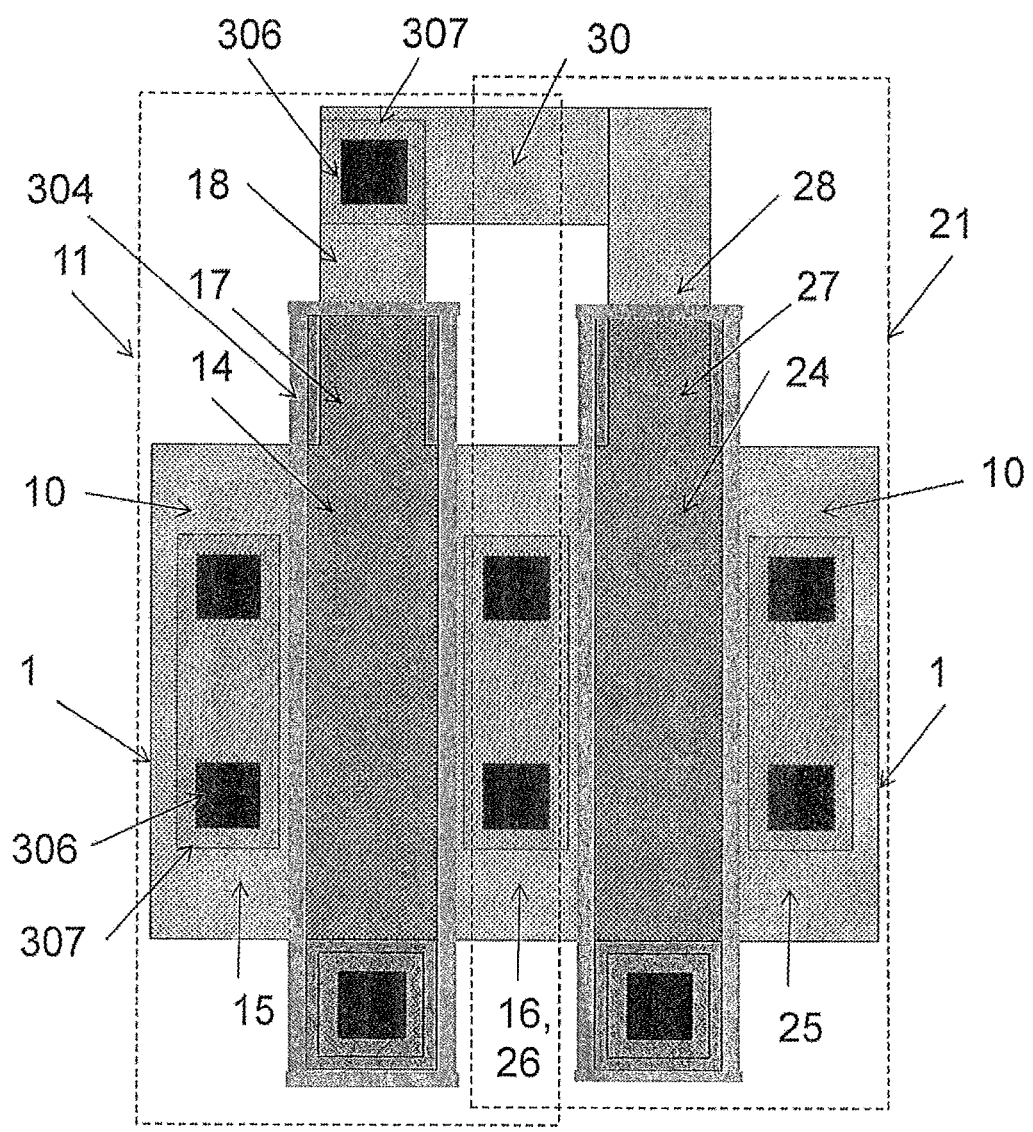
FIG. 6 is a plan view illustrating a configuration of a semiconductor device according to a second modified example of the first embodiment.

FIG. 6 is a plan view schematically illustrating a configuration of a semiconductor device according to a second modified example of the first embodiment.

In the first embodiment, the connection portion 18 in the first transistor 11 and the connection portion 28 in the second transistor 21 are connected to each other in the interconnect layer 307 via the contact portions 306. In the second modified example, the connection portions 18 and 28 are connected to each other in a P⁺ diffusion layer 30. Thus, there is no need to provide the contact portion 306 and the interconnect layer 307 in one of the connection portions 18 and 28, that is, the connection portion 28 herein, and therefore, the connection portion 28 can be also used as another interconnect region. Accordingly, the degree of freedom of layout design can be increased.

First Application Example of First Embodiment

Figure 7:
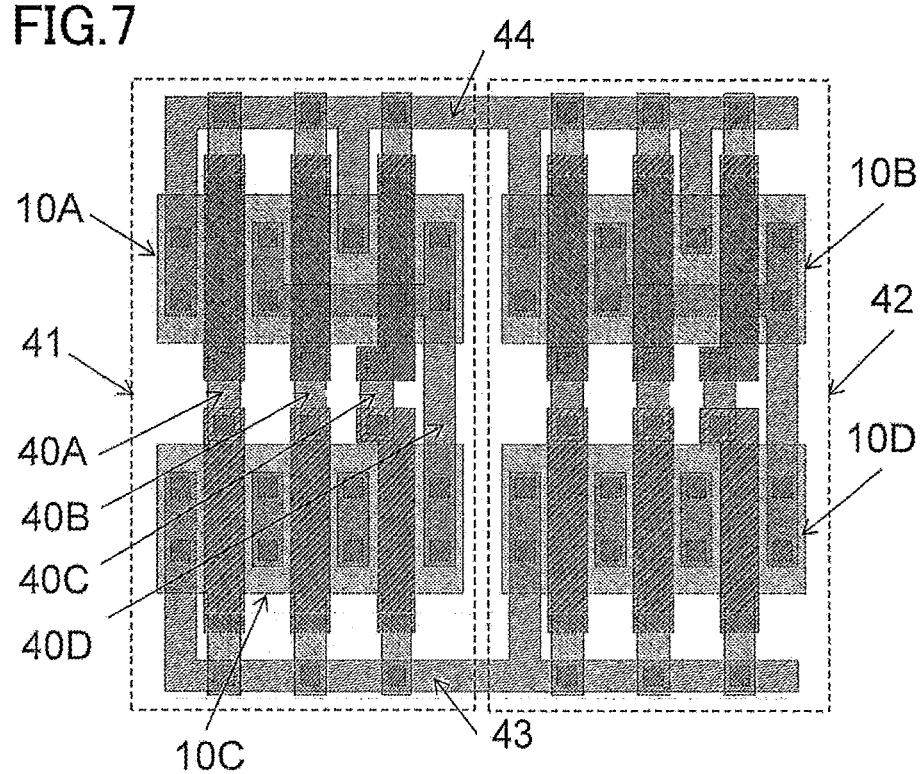
FIG. 7 is a plan view illustrating a configuration of a semiconductor device according to a first application example of the first embodiment.

FIG. 7 is a plan view schematically illustrating a configuration of a semiconductor device according to a first application example of the first embodiment.

In this application example, using transistors having the configuration described in the first embodiment, a logic circuit is configured. Specifically, in this application example, a configuration in which two three-input NAND circuits 41 and 42 are arranged is employed. The reference sign 43 denotes a ground voltage signal and the reference sign 44 denotes a power supply voltage signal. The circuit 41 is a circuit in which an output 40D is provided for three inputs 40A, 40B, and 40C.

In this application example, in each of four body regions 10A to 10D, three transistors are formed, and source regions and drain regions of the transistors are made common via a diffusion layer. Thus, the arrangement pitch of the transistors is minimized, and the layout area can be designed to be small.

Second Application Example of First Embodiment

Figure 8:
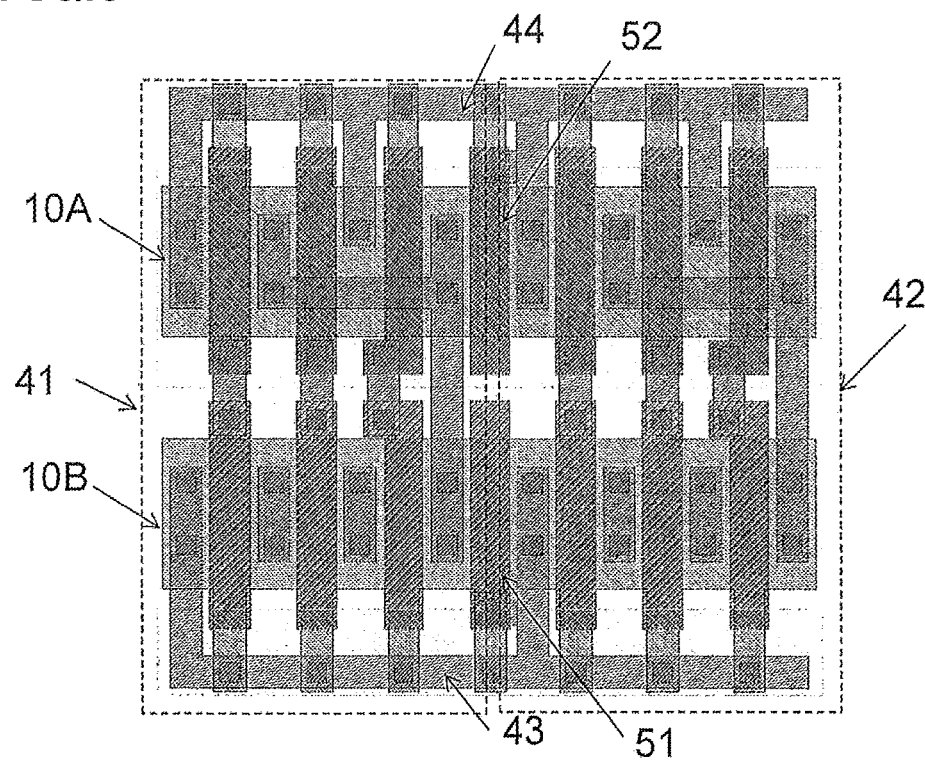
FIG. 8 is a plan view illustrating a configuration of a semiconductor device according to a second application example of the first embodiment.

FIG. 8 is a plan view schematically illustrating a configuration of a semiconductor device according to a second application example of the first embodiment.

In this application example, the three-input NAND circuits 41 and 42 are not isolated by an element isolation region but are connected via the body regions 10A and 10B, and gate electrodes 51 and 52 that turn off the transistors are formed on the body regions 10A and 10B. Thus, the two NAND circuits 41 and 42 are electrically isolated from each other. Note that the gate electrode 51 is connected to the ground voltage signal 43 and the gate electrode 52 is connected to the power supply voltage signal 44. The body regions 10A and 10B can be simplified by employing the above described layout. Therefore, increased process stability can be achieved, and furthermore, a product yield can be increased.

Third Application Example of First Embodiment

Figure 9:
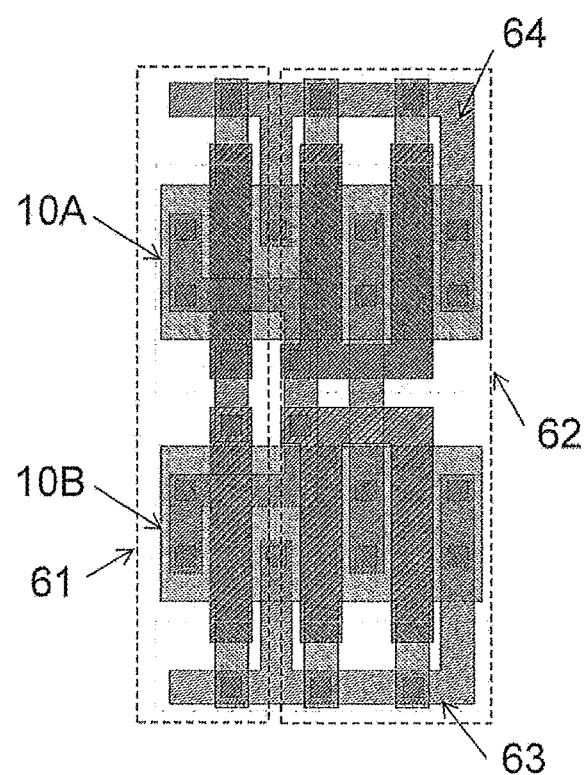
FIG. 9 is a plan view illustrating a configuration of a semiconductor device according to a third application example of the first embodiment.

FIG. 9 is a plan view schematically illustrating a configuration of a semiconductor device according to a third application example of the first embodiment.

In this application example, using transistors having the configuration described in the first embodiment, a logic circuit is configured. Specifically, in this application example, a configuration in which two inverter circuits 61 and 62 are connected in series is employed. The reference sign 63 denotes a ground voltage signal and the reference sign 64 denotes a power supply voltage signal.

In this application example, drive capability of a transistor of the inverter circuit 62 is twice drive capability of a transistor of the inverter circuit 61. As the transistor of the inverter circuit 62, a transistor divided into two is used, and respective gates thereof are connected via a gate layer.

In this application example, a configuration in which a P-channel transistor and an N-channel transistor are connected to each other in a side in which respective regions thereof are opposed to each other is employed, but a layout in which the P-channel transistor and the N-channel transistor are connected to each other in a side in which respective connection portions thereof are arranged may be employed.

Second Embodiment

Figure 10:
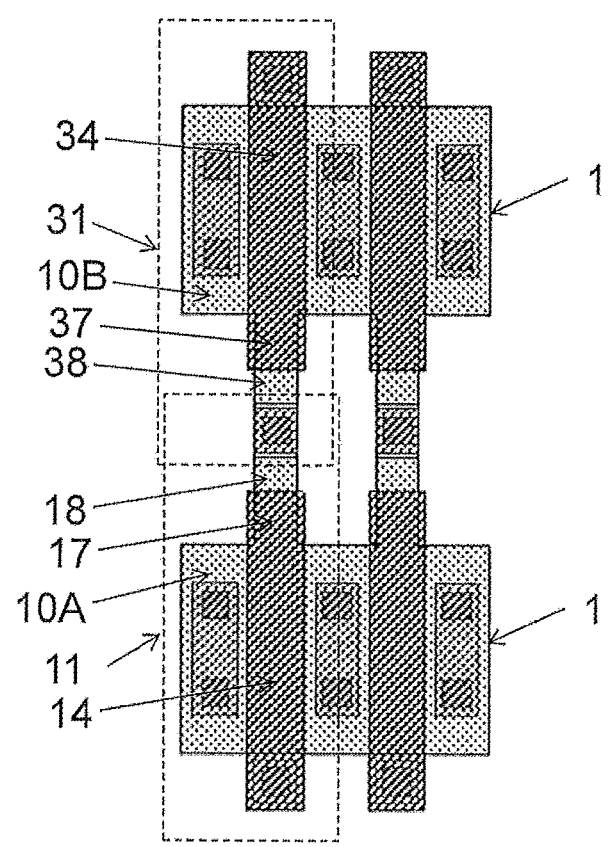
FIG. 10 is a plan view illustrating a configuration of a semiconductor device according to a second embodiment of the present disclosure.

FIG. 10 is a plan view schematically illustrating a configuration of a semiconductor device according to a second embodiment of the present disclosure.

In the first embodiment, the first transistor 11 and the second transistor 21 are arranged in a perpendicular direction to a gate direction. In this embodiment, a third transistor 31 is further arranged in the gate direction with respect to the first transistor 11. Note that, in this embodiment, the third transistor 31 is formed in an active region that is the same as the active region 1 in which the first transistor 11 is formed.

The active region 1 includes a second body region 10B in which the third transistor 31 is formed, a second connection portion 38 to which a potential of the second body region 10B is connected, and a second lead portion 37 that connects the second body region 10B and the second connection portion 38. The second lead portion 37 extends from a channel region of the third transistor 31 in an opposite direction to the lead portion 17 of the first transistor 11, and the second connection portion 38 is formed with the connection portion 18 of the first transistor 11 in a common region so that the second connection portion 38 and the connection portion 18 have the same potential. In this embodiment, the connection portion 18 of the first transistor 11 and the second connection portion 38 of the third transistor 31 are formed of the same diffusion layer.

In this embodiment, the two connection portions 18 and 38 are made common, and thus, a layout area can be reduced. In some cases, the size of the element isolation regions cannot make a certain size or smaller than the certain size in terms of process. However, as described above, the two connection portions 18 and 38 are made common, and thus, the size of the element isolation regions can be ensured, so that the element isolation regions can be stably formed.

Application Example of Second Embodiment

Figure 11:
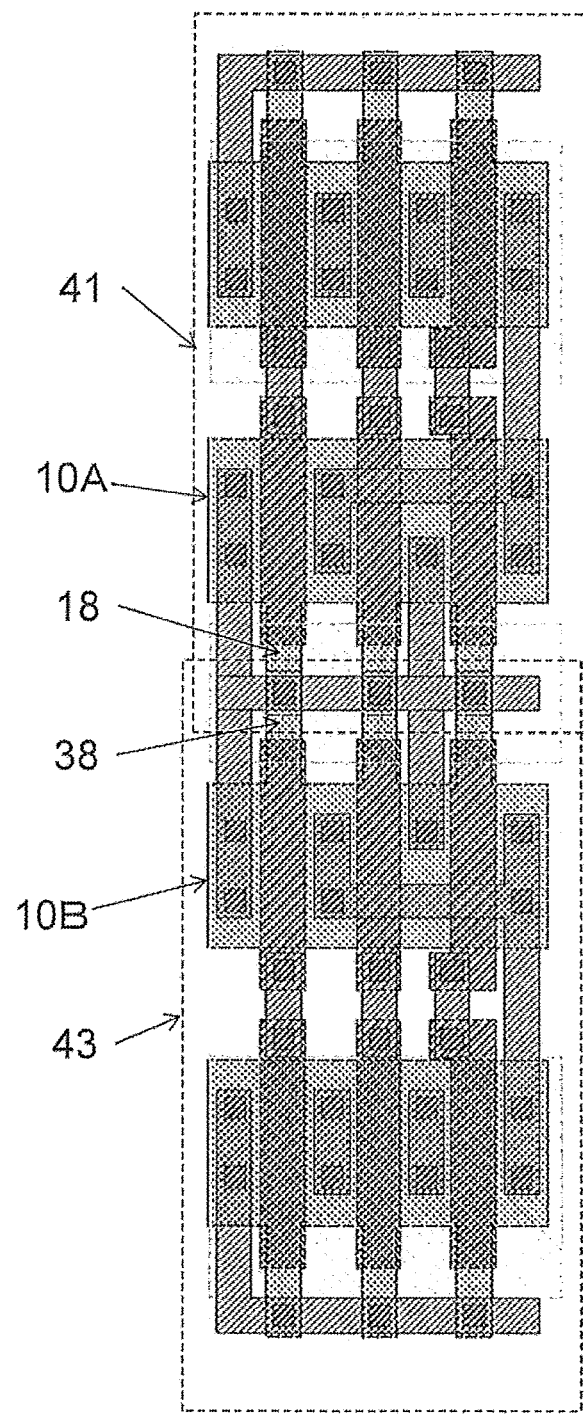
FIG. 11 is a plan view schematically illustrating a configuration of a semiconductor device according to an application example of the second embodiment.

FIG. 11 is a plan view schematically illustrating a configuration of a semiconductor device according to an application example of the second embodiment.

In this application example, using the configuration of the semiconductor device of the second embodiment, a logic circuit is configured. Specifically, in this application example, a configuration in which two three-input NAND circuits 41 and 43 are arranged is employed.

In this application example, the connection portion 18 of the transistor formed in the body region 10A in the circuit 41 and the connection portion 38 of a transistor formed in the body region 10B in the circuit 43 are made common, and thus, a layout area can be reduced. Note that, in this embodiment, only the connection portion 18 and the connection portion 38 are made common in a longitudinal direction, but the connection portion 18 and the connection portion 38 can be also made common with a connection portion of an adjacent transistor via an active region.

Third Embodiment

Figure 12:
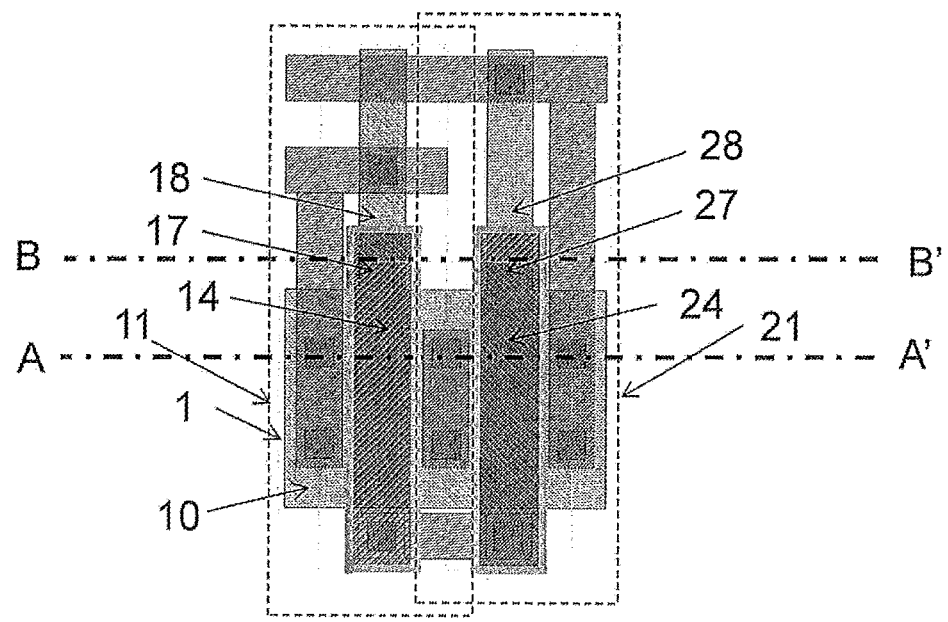
FIG. 12 is a plan view illustrating a configuration of a semiconductor device according to a third embodiment of the present disclosure.
Figure 13:
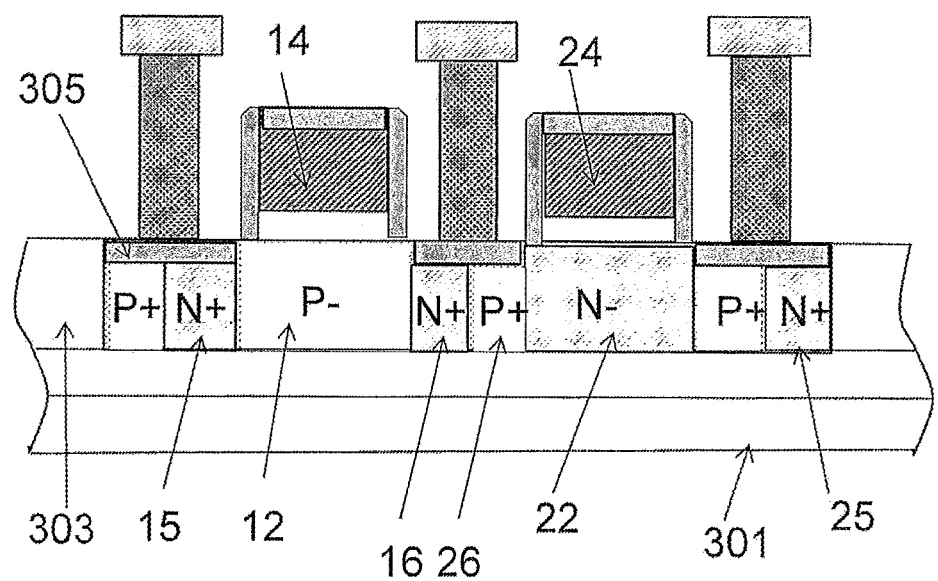
FIG. 13 is a cross-sectional view taken along line A-A' of FIG. 12.
Figure 14:
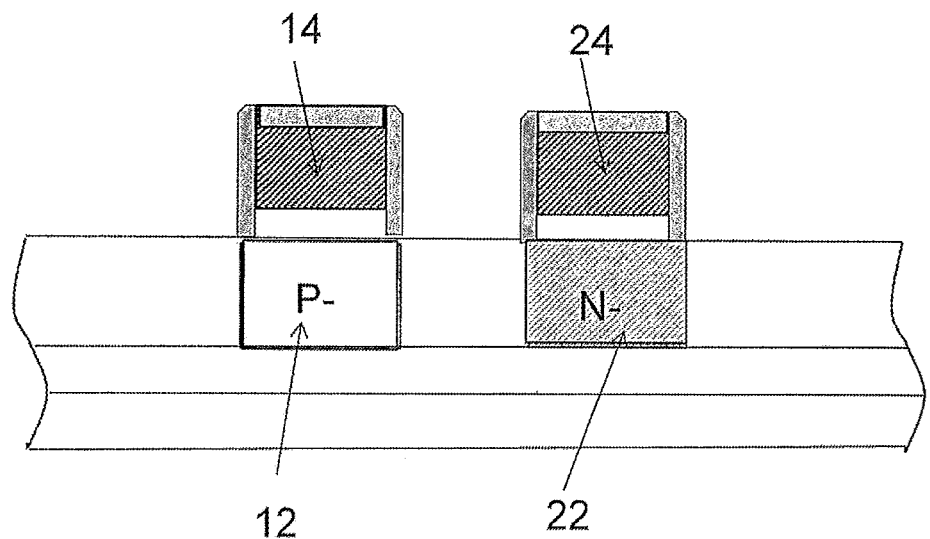
FIG. 14 is a cross-sectional view taken along line B-B' of FIG. 12.

FIG. 12 to FIG. 14 are views schematically illustrating a configuration of a semiconductor device according to a third embodiment of the present disclosure. FIG. 12 is a plan view, and FIG. 13 and FIG. 14 are cross-sectional views taken along the line A-A' and the line B-B' of FIG. 12, respectively.

In the first embodiment, two transistors formed in a body region are transistors of the same channel type. In this embodiment, two transistors formed in a body region are complementary transistors. A semiconductor device according to this embodiment is an application example in which, using complementary transistors, a logic circuit (an inverter circuit) is configured.

In this embodiment, a P-channel transistor 11 and an N-channel transistor 21 are formed in the same active region 1 defined by the element isolation film 303. The active region 1 includes a body region 10 in which the transistors 11 and 12 are formed, connection portions 18 and 28 to which the potential of the body region 10 is connected, and lead portions 17 and 27 that connect the body region 10 and the connection portions 18 and 28 to each other.

Each of the transistors 11 and 12 formed in the body region 10 includes a corresponding one of channel regions 12 and 22, a corresponding one of gate electrodes 14 and 24 formed on the channel regions 12 and 22 via a gate insulation film, and a corresponding one of source regions 15 and 25 and a corresponding one of drain regions 16 and 26 formed with the corresponding one of the channel regions 12 and 22 interposed therebetween. The drain regions 16 and 26 of the transistors 11 and 21 are formed in a common region and have the same potential. Note that, in this embodiment, a silicide layer 305 is formed on the drain region 16 formed of an N+ diffusion layer and the drain region 26 formed of a P+ diffusion layer, and thus, the drain regions 16 and 26 have the same potential.

An input signal is connected to each of the respective gate electrodes 14 and 24 of the transistors, and the drain regions 16 and 26 that have been made common are outputs. In this embodiment, the connection portions 18 and 28 are led out in the same direction, and the connection portions 18 and 28 are connected to a power supply potential and a ground potential, respectively.

In this embodiment, a logic circuit can be formed in one active region 1, and the logic circuit can be configured in a compact region.

Modified Example of Third Embodiment

Figure 15:
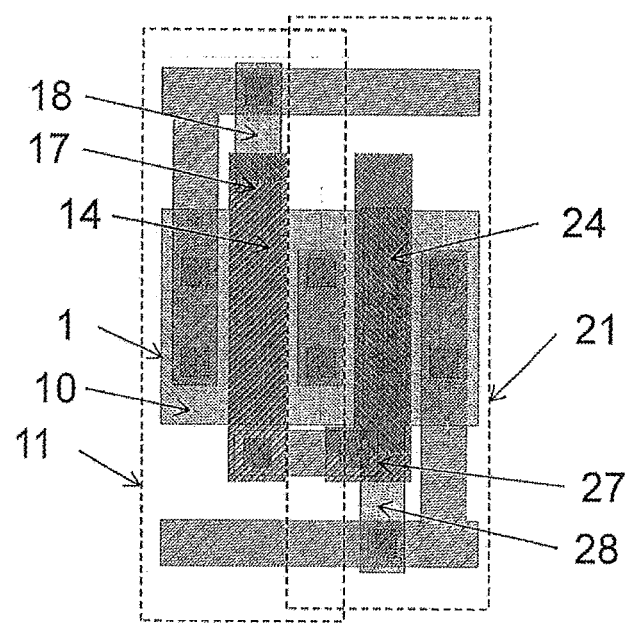
FIG. 15 is a plan view illustrating a configuration of a semiconductor device according to a modified example of the third embodiment.

FIG. 15 is a plan view schematically illustrating a configuration of a semiconductor device according to a modified example of the third embodiment.

In this modified example, a configuration in which the connection portions 18 and 28 of the two transistors are led out in different directions is employed. Thus, the power supply potential and the ground potential can be led out in different directions. Therefore, when a plurality of logic circuits are arranged, respective connection portions in the logic circuits can be made common and thus arranged in a simple manner.

First Application Example of Third Embodiment

Figure 16:
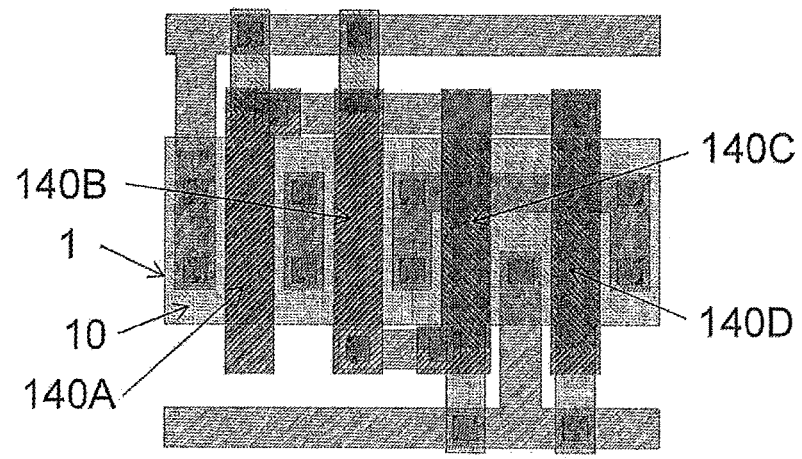
FIG. 16 is a plan view illustrating a configuration of a semiconductor device according to a first application example of the third embodiment.

FIG. 16 is a plan view schematically illustrating a configuration of a semiconductor device according to a first application example of the third embodiment.

In this application example, two P-channel transistors and two N-channel transistors form a two-input NAND circuit. Gate electrodes 140A and 140D are first input signals, and gate electrodes 140B and 140C are second input signals. This configuration allows a compact layout with reduced dimensions in a height direction.

Second Application Example of Third Embodiment

Figure 17:
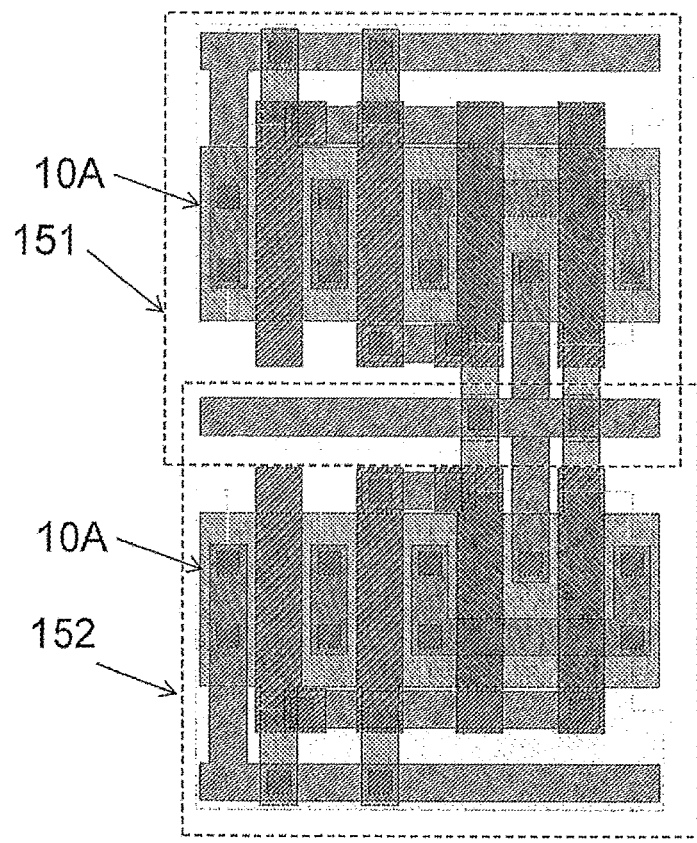
FIG. 17 is a plan view illustrating a configuration of a semiconductor device according to a second application example of the third embodiment.

FIG. 17 is a plan view schematically illustrating a configuration of a semiconductor device according to a second application example of the third embodiment.

In this application example, two two-input NAND circuits 151 and 152 are arranged in a folded manner. This configuration allows a compact layout.

Fourth Embodiment

Figure 18:
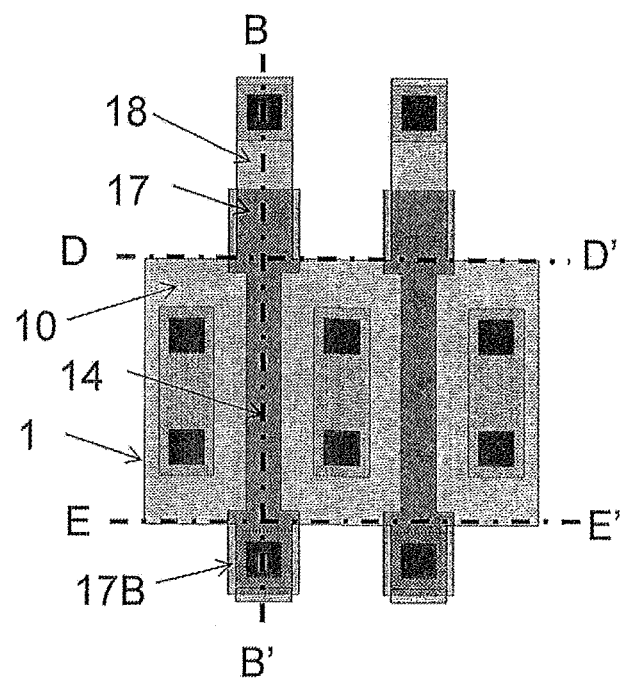
FIG. 18 is a plan view illustrating a configuration of a semiconductor device according to a fourth embodiment of the present disclosure.
Figure 19:
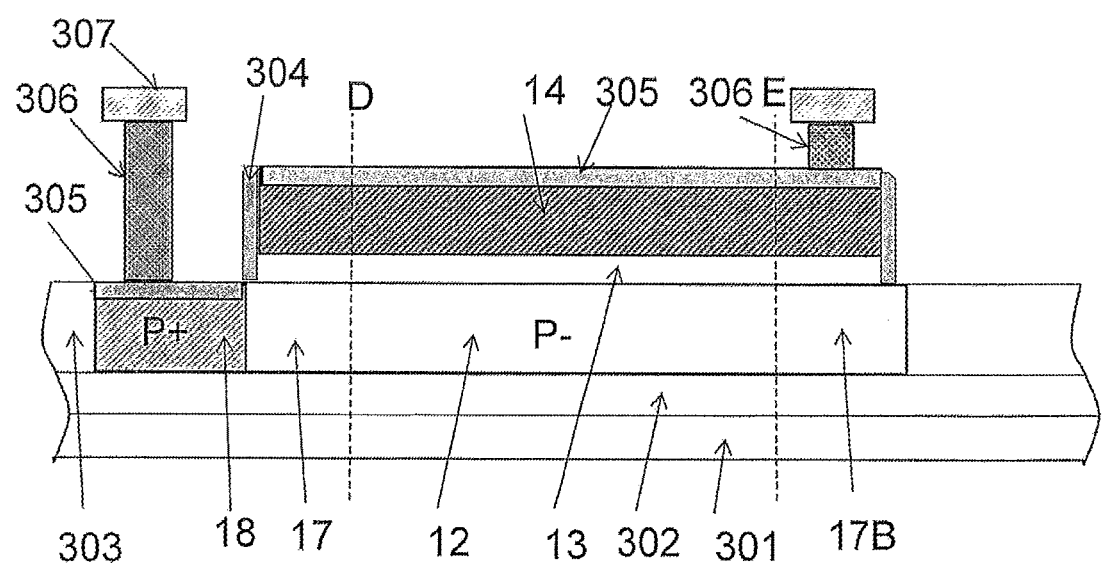
FIG. 19 is a cross-sectional view taken along the line B-B' of FIG. 18.

FIG. 18 and FIG. 19 are views schematically illustrating a configuration of a semiconductor device according to a fourth embodiment of the present disclosure. FIG. 18 is a plan view, and FIG. 19 is a cross-sectional view taken along the line B-B' of FIG. 18.

In the first embodiment, as illustrated in FIG. 1, the lead portion 17 is provided to extend from the channel region 12 of the corresponding transistor formed in the body region 10 in a direction perpendicular to the corresponding channel direction. In this embodiment, a lead portion 17B is further provided to extend from an opposite side to a side from which the lead portion 17 extends. Note that the gate electrode 14 extending on the lead portion 17 and the gate electrode 14 extending on the lead portion 17B have the same shape.

In terms of a transistor, both of the lead portions 17 and 17B as channels also contribute to an operation a little. Therefore, the lead portions 17 and 17B are arranged in a direction perpendicular to the channel direction so as to be symmetrical with respect to the body region 10. Thus, even when a mask is displaced in the direction perpendicular to the channel direction in gate processing, fluctuations of transistor characteristics can be reduced. Thus, it is possible to design with stable transistor characteristics.

Modified Example of Fourth Embodiment

Figure 20:
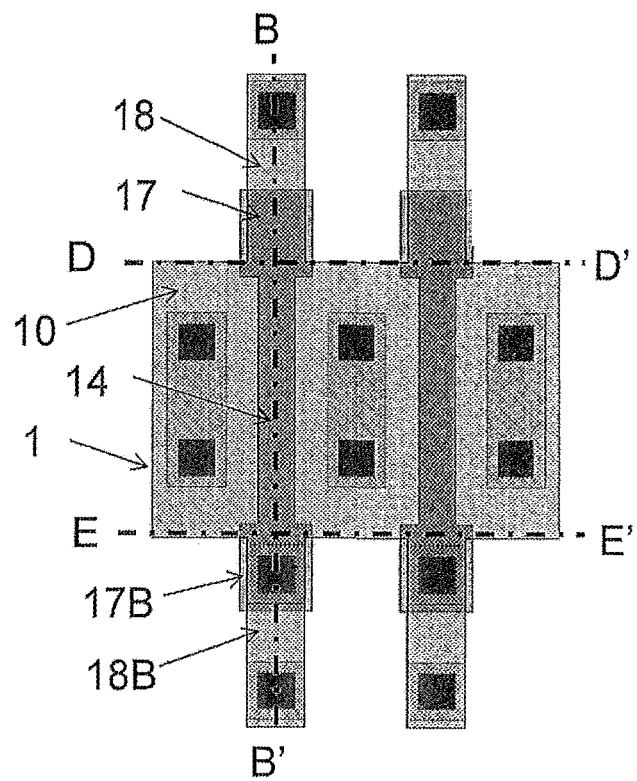
FIG. 20 is a plan view illustrating a configuration of a semiconductor device according to a modified example of the fourth embodiment.
Figure 21:
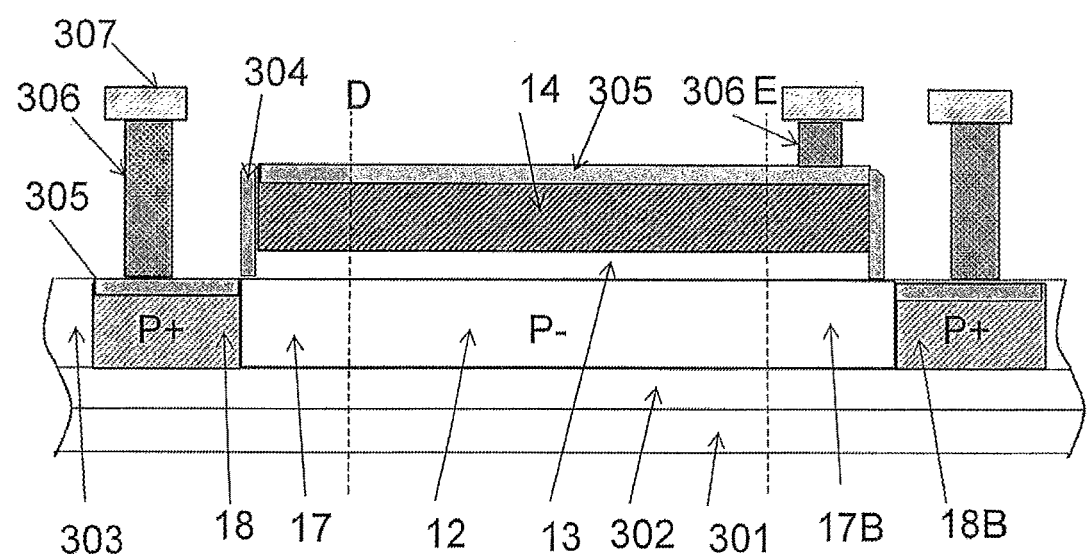
FIG. 21 is a cross-sectional view taken along the line B-B' of FIG. 20.

FIG. 20 and FIG. 21 are views schematically illustrating a configuration of a semiconductor device according to a modified example of the fourth embodiment. FIG. 20 is a plan view, and FIG. 21 is a cross-sectional view taken along the line B-B' of FIG. 20.

In this modified example, a configuration in which a connection portion 18B to which the potential of the body region 10 is connected is further connected to the lead portion 17B is employed. Thus, the potential of the body region 10 can be made common by the connection portions 18 and 18B formed at both sides of the body region 10, and therefore, more stable transistor characteristics can be achieved.

Fifth Embodiment

Figure 22:
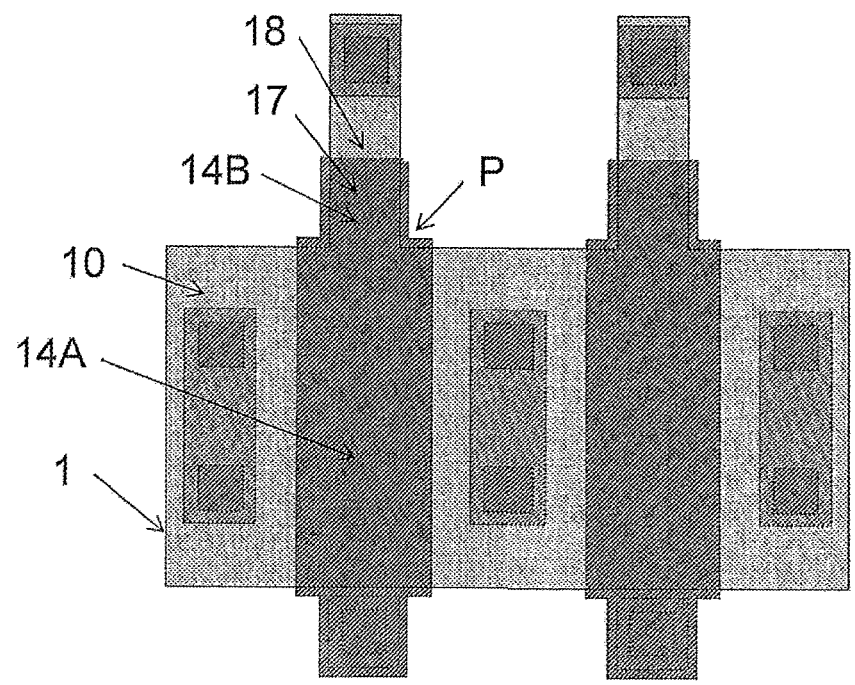
FIG. 22 is a plan view illustrating a configuration of a semiconductor device according to a fifth embodiment of the present disclosure.
Figure 23:
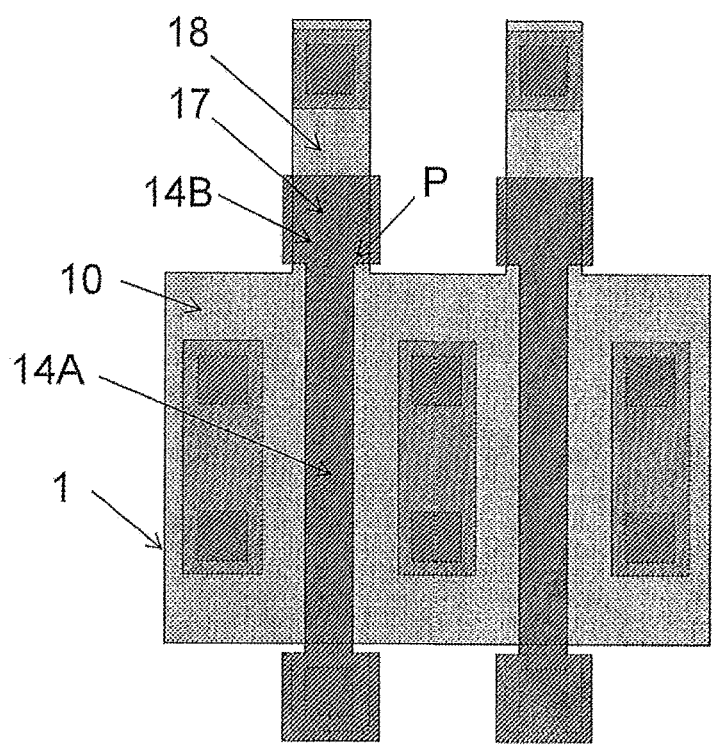
FIG. 23 is a plan view illustrating a configuration of a semiconductor device according to a fifth embodiment of the present disclosure.

FIG. 22 and FIG. 23 are plan views schematically illustrating a configuration of a semiconductor device according to a fifth embodiment of the present disclosure.

In the first embodiment, the width of the gate electrode 14 formed on the channel region and the width of the gate electrode 14 extending on the lead portion 17 are the same. In this embodiment, a width of a gate electrode 14A formed on a channel region and a width of a gate electrode 14B extending on the lead portion 17 are different. In FIG. 22, the width of the gate electrode 14A is wider than the width of the gate electrode 14B and, in FIG. 23, the width of the gate electrode 14A is narrower than the width of the gate electrode 14B. A boundary P between the gate electrode 14A formed on the channel region and the gate electrode 14B extending on the lead portion 17 is positioned in an outer side than a boundary of the body region 10 in which transistors are formed.

In this embodiment, the gate electrode 14A formed on the channel region is perpendicular to the boundary of the body region 10. Thus, even when a mask is displaced in the direction perpendicular to the channel direction in gate processing, fluctuations of transistor characteristics can be reduced.

Moreover, as illustrated in FIG. 23, when the width of the gate electrode 14A is narrower than the width of the gate electrode 14B, the gate electrode 14B is arranged perpendicular to the boundary of the lead portion 17, and thus, a capacitance due to the sidewall insulation film 304 of the gate electrode 14 can be reduced.

Sixth Embodiment

Figure 24:
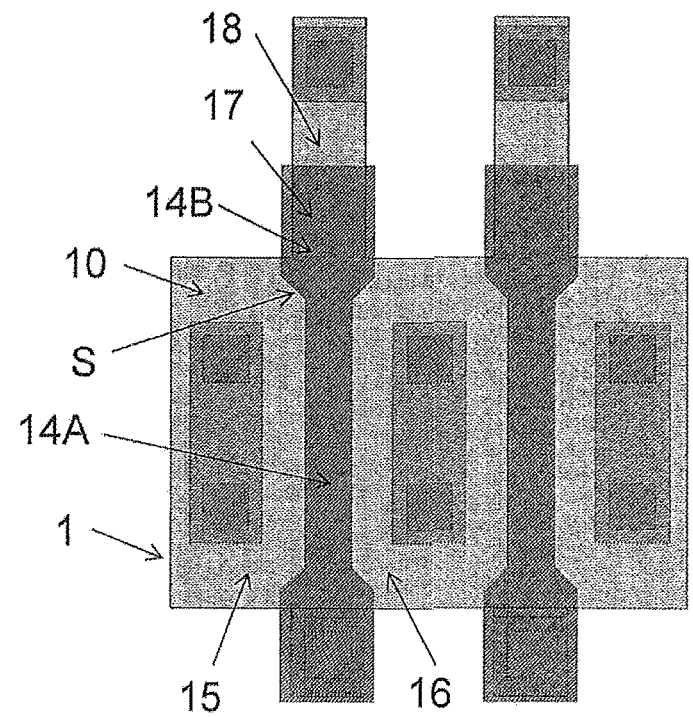
FIG. 24 is a plan view illustrating a configuration of a semiconductor device according to a sixth embodiment of the present disclosure.

FIG. 24 is a plan view schematically illustrating a configuration of a semiconductor device according to a sixth embodiment of the present disclosure.

In this embodiment, the width of the gate electrode 14A formed on the channel region and the width of the gate electrode 14B extending on the lead portion 17 are different, and a boundary S between the gate electrode 14A and the gate electrode 14B is positioned in an inner side than the boundary of the body region 10 in which transistors are formed.

In this embodiment, the boundary S between the gate electrode 14A formed on the channel region and the gate electrode 14B extending on the lead portion 17 is tilted by an angle of 135 degrees or more. Thus, an angle of each of the source region 15 and the drain region 16 of the transistor with respect to the gate electrode 14A is equal to or larger than 135 degrees. Therefore, even when a high voltage is applied between the source and the drain, occurrence of breakdown in an edge portion of the gate can be suppressed.

Seventh Embodiment

Figure 25:
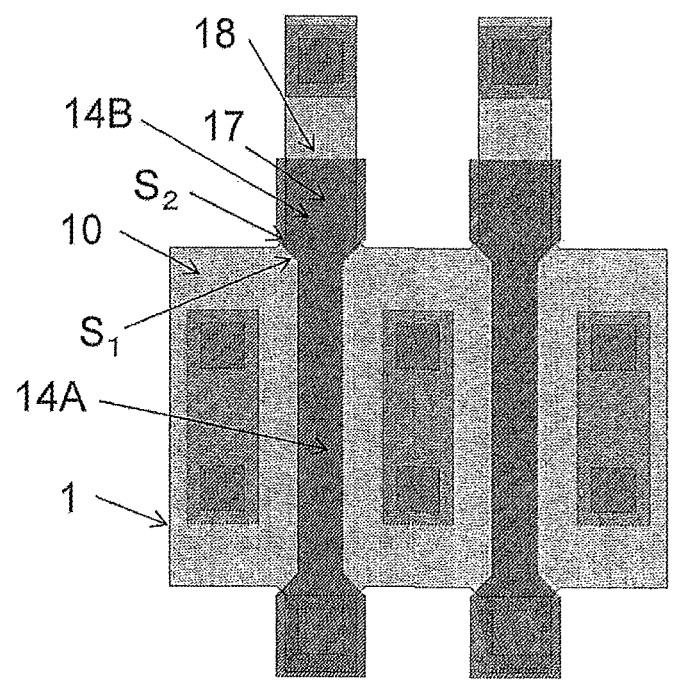
FIG. 25 is a plan view schematically illustrating a configuration of a semiconductor device according to a seventh embodiment of the present disclosure.

FIG. 25 is a plan view schematically illustrating a configuration of a semiconductor device according to a seventh embodiment of the present disclosure.

In this embodiment, a boundary $S_1$ between the gate electrode 14A formed on the channel region and the gate electrode 14B extending on the lead portion 17 and a boundary $S_2$ between the body region 10 in which transistors are formed and the lead portion 17 are perpendicular to each other. Thus, even when a mask is displaced in the direction perpendicular to the channel direction in gate processing, fluctuations of transistor characteristics can be reduced. Furthermore, even when a high voltage is applied between the source and the drain, occurrence of breakdown in an edge portion of the gate can be suppressed.

Eighth Embodiment

In a switch circuit that isolates a signal to an antenna, a high voltage is applied in some cases. To cope with this, a configuration in which a plurality of transistors are connected in series is employed. However, even in such switch circuits, it is required to reduce a capacitance in each position and ensure high speed characteristics.

Figure 26:
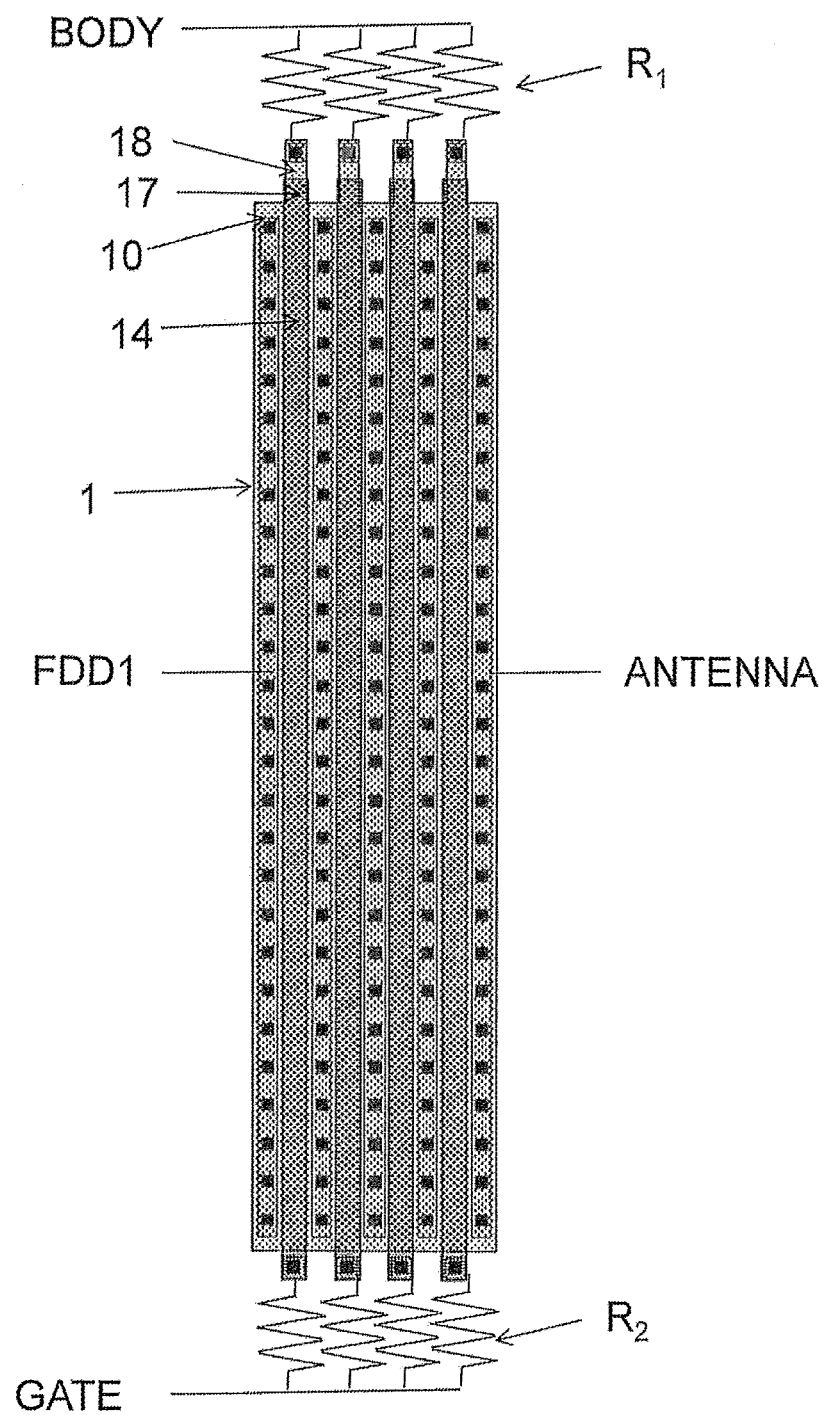
FIG. 26 is a plan view illustrating an example of an eight embodiment of the present disclosure.

FIG. 26 is a plan view illustrating an application example of such a circuit. In this application example, a configuration in which a plurality of transistors are arranged in series in the body region 10 and source regions and drain regions of adjacent ones of the transistors are connected to each other via a diffusion layer is employed. Moreover, a signal line is connected, via a resistor $R_1$ with a high resistance, to each connection portion 18 connected to the body region 10 via the corresponding lead portion 17. Also, a signal line is connected, via a resistor $R_2$ with a high resistance, to each gate electrode 14.

As in this application example, source regions and drain regions of adjacent ones of the transistors are connected to each other not via an interconnect but via a diffusion layer, and thus, a capacitance in each of respective contacts connected to the source regions and the drain regions, a capacitance between an interconnect and a gate, and a capacitance between wafer substrates can be largely reduced.

Figure 27:
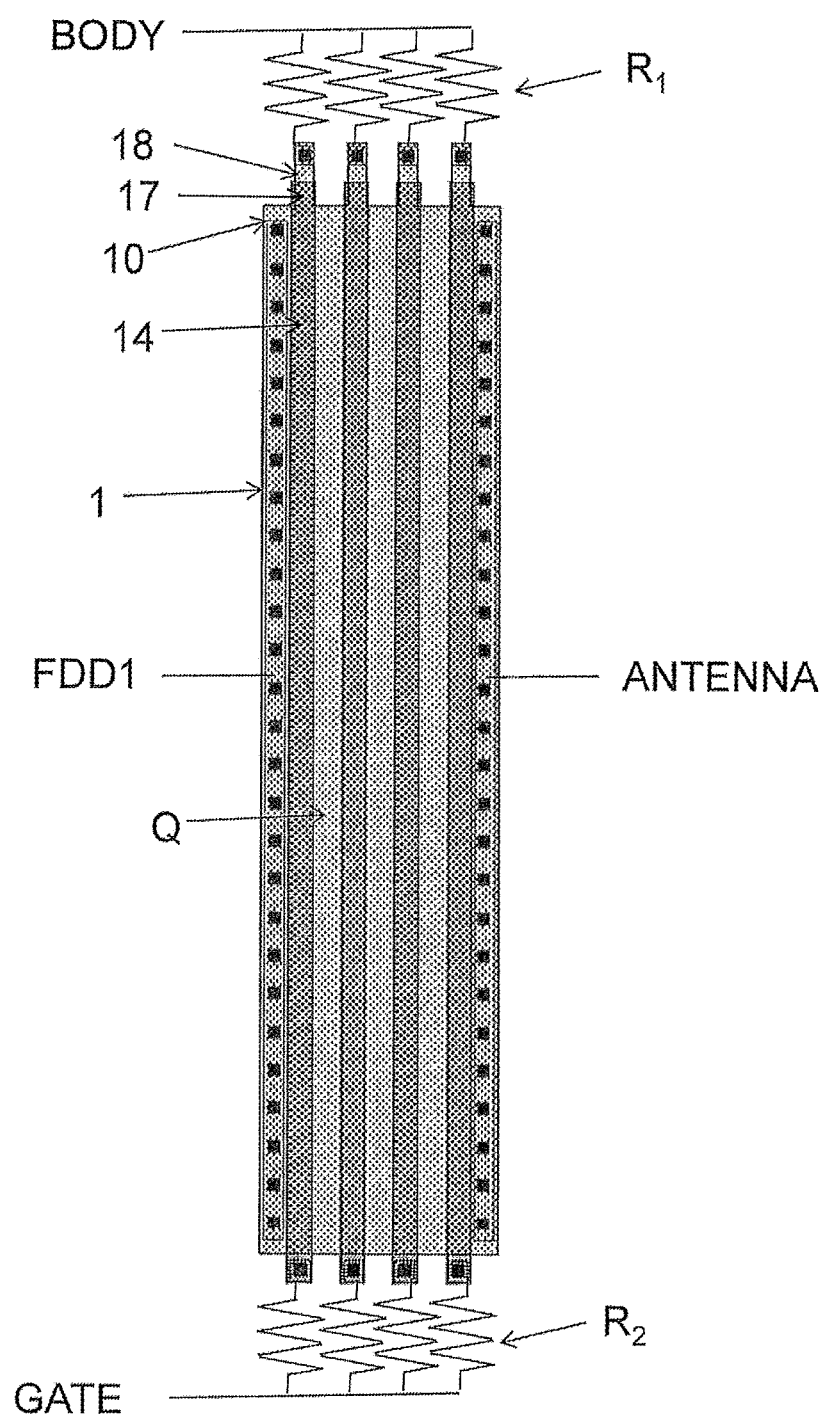
FIG. 27 is a plan view illustrating another example of the eighth embodiment of the present disclosure.

As illustrated in FIG. 27, in a portion Q shared by the source regions or the drain regions of the plurality of transistors, contacts and interconnects are eliminated, and thus, capacitances between contacts or interconnects and the gate can be largely reduced, so that reduction in parasitic capacitance can be achieved.

Ninth Embodiment

In the eighth embodiment, one transistor group including four transistors connected in series has been described. In this embodiment, as illustrated in FIG. 28, a configuration in which a plurality of such transistor groups are arranged is employed.

Figure 28:
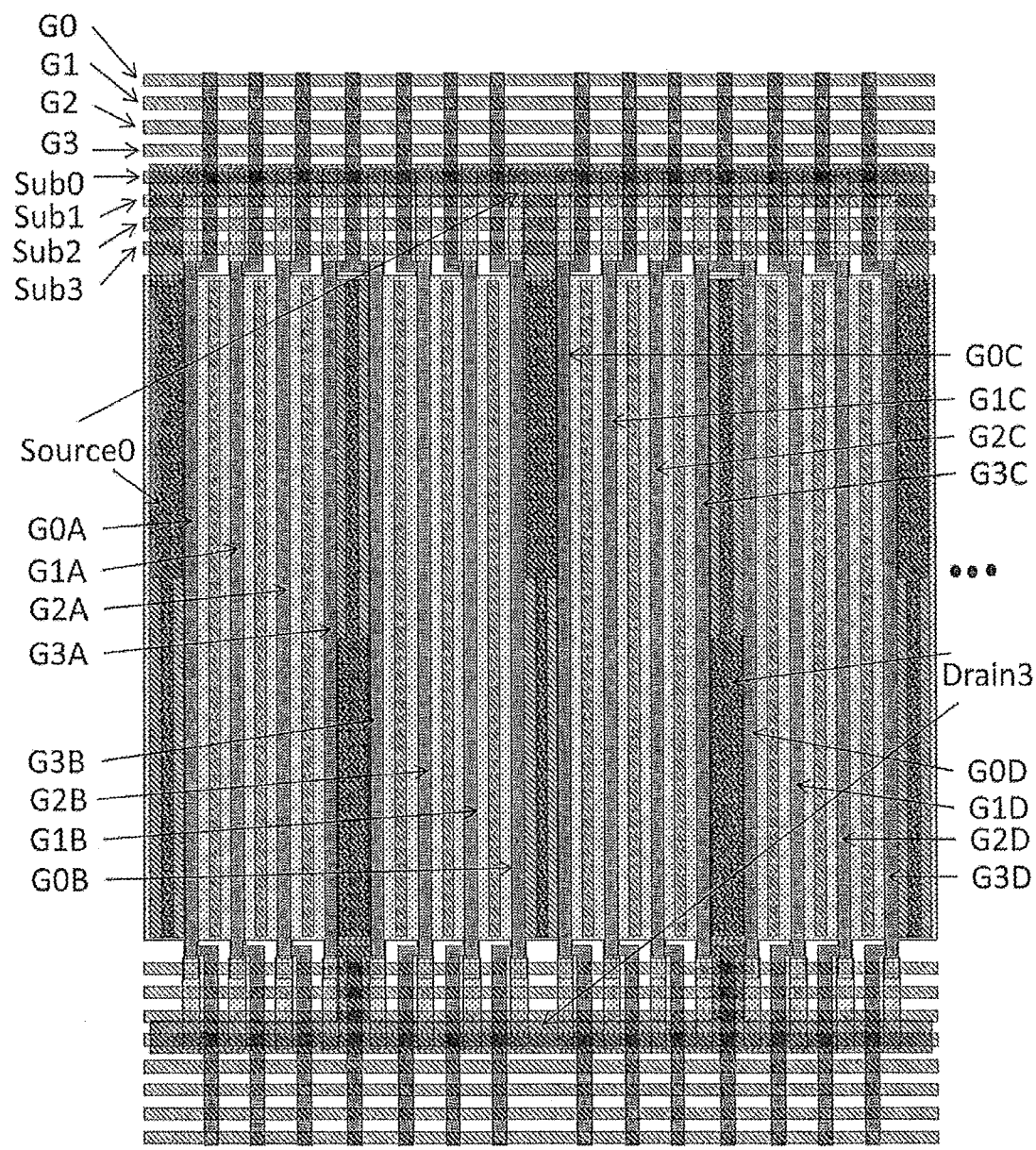
FIG. 28 is a plan view illustrating a configuration of a semiconductor device according to a ninth embodiment of the present disclosure.

In FIG. 28, first to fourth gate electrodes G0A, G1A, G2A, and G3A of a first transistor group are arranged from a left end between a source region and a drain region. Next, fourth to first gate electrodes G3B, G2B, G1B, and G0B of a second transistor group are arranged between the drain region and a source region. A configuration with a large gate length can be achieved by arranging the gate electrodes in the above described manner. Respective gate electrodes of the transistor groups are made common via interconnects G0, G1, G2, and G3 in an upper layer. Respective channel regions of the transistor groups extend via lead portions and connection portions under the gate electrodes and are made common by interconnects Sub0, Sub1, Sub2, and Sub3 in an upper layer.

Figure 29:
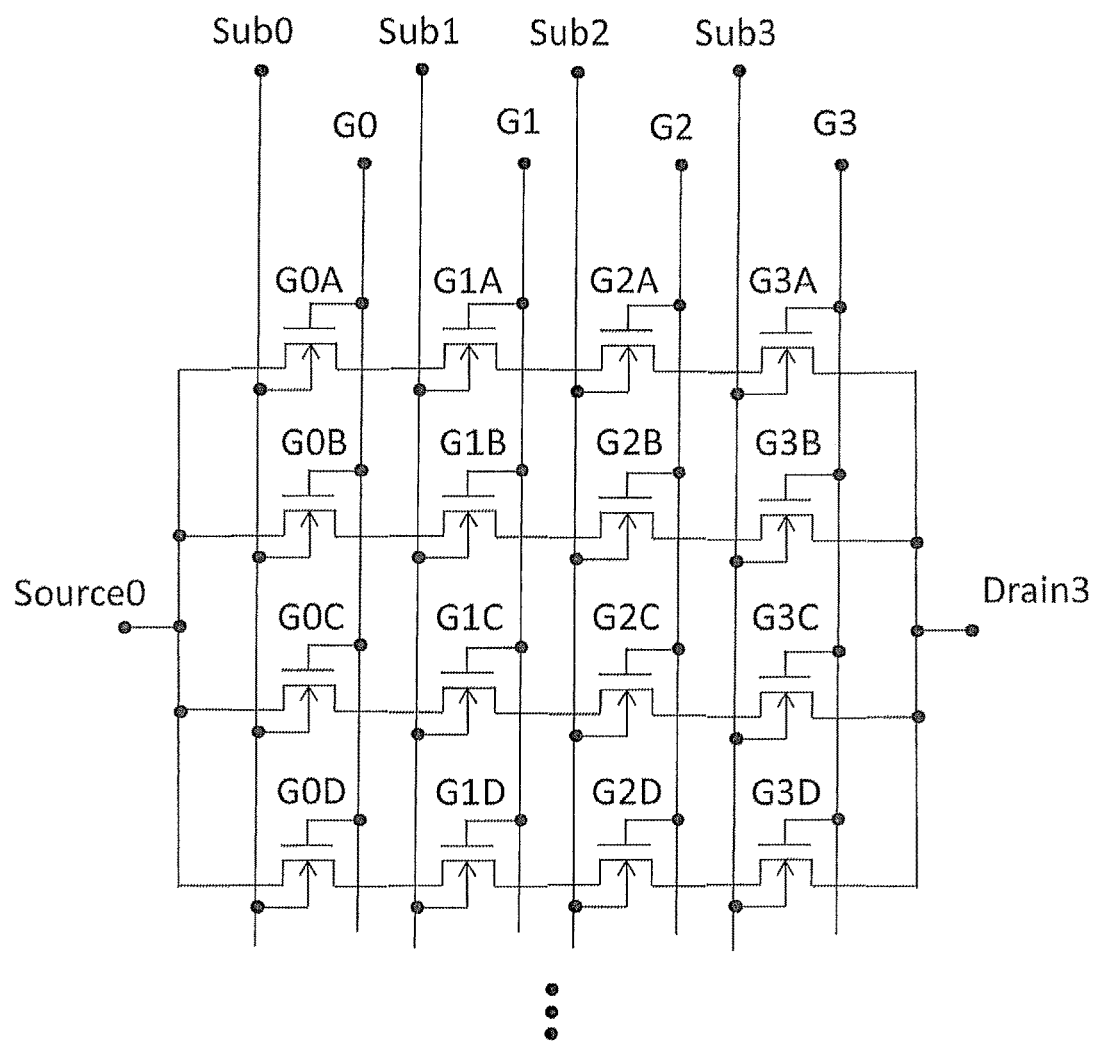
FIG. 29 is an equivalency circuit diagram of a semiconductor device according to the ninth embodiment of the present disclosure.

Although not illustrated in FIG. 28, a configuration in which each of the channel regions is connected to a BODY signal from a corresponding one of the interconnects Sub0, Sub1, Sub2, and Sub3 via a corresponding resistor, or the like, can be employed. In this embodiment, potentials of the channel regions are denoted by the reference signs Sub0, Sub1, Sub2, and Sub3 only in an interconnect layer in an upper side in FIG. 28, but are also led out from a lower side in FIG. 28. Floating of the channel regions can be suppressed by setting the potentials of the channel regions from both of the upper and lower sides. An equivalent circuit of this embodiment is as illustrated in FIG. 29.

Figure 30:
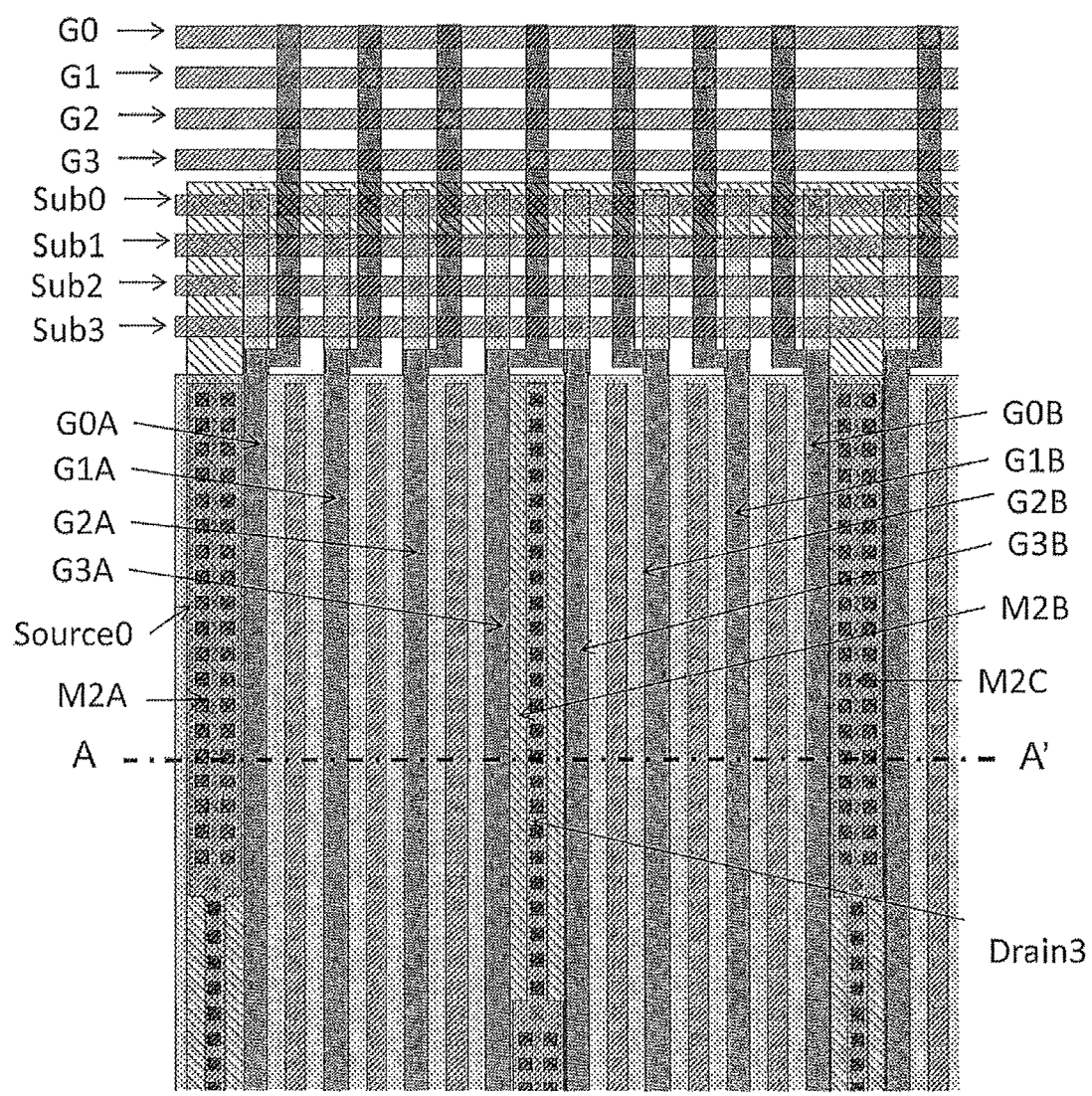
FIG. 30 is an enlarged plan view illustrating a configuration of a semiconductor device according to the ninth embodiment of the present disclosure.
Figure 31:
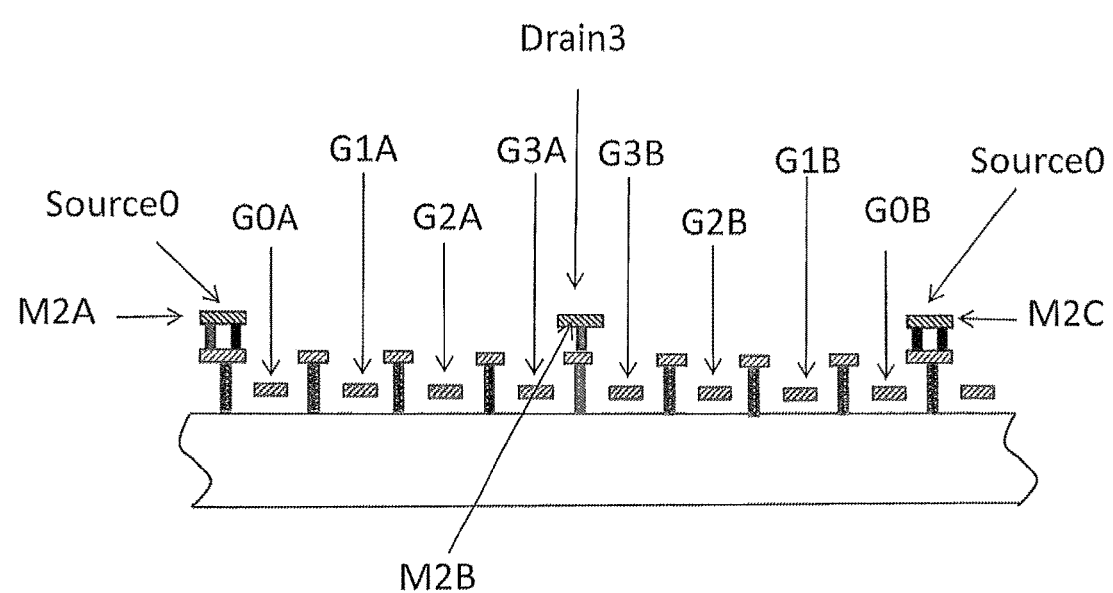
FIG. 31 is a cross-sectional view taken along the line A-A' of FIG. 30.

FIG. 30 is an enlarged view of an upper left portion of FIG. 28. FIG. 31 is a cross-sectional view taken along the line A-A' of FIG. 30. As can be seen from the cross-sectional view, first, the gate electrodes G0A, G1A, G2A, G3A, G0B, G1B, G2B, and G3B of the transistors are arranged, a first interconnect layer (with no reference sign) is formed as an upper layer thereon, and furthermore, a second interconnect layer is formed as an upper layer thereon. Herein, in the second interconnect layer, Source 0 (M2A), Drain 3 (M2B), and Source 0 (M2C) are arranged from left in the cross-sectional view, and an interconnect capacitance exists between Source 0 and Drain 3. This capacitance increases, in particular, as a thickness of the interconnect layer increases, and also influences operation speed. Therefore, in general, it is desired to reduce the capacitance.

Tenth Embodiment

Figure 32:
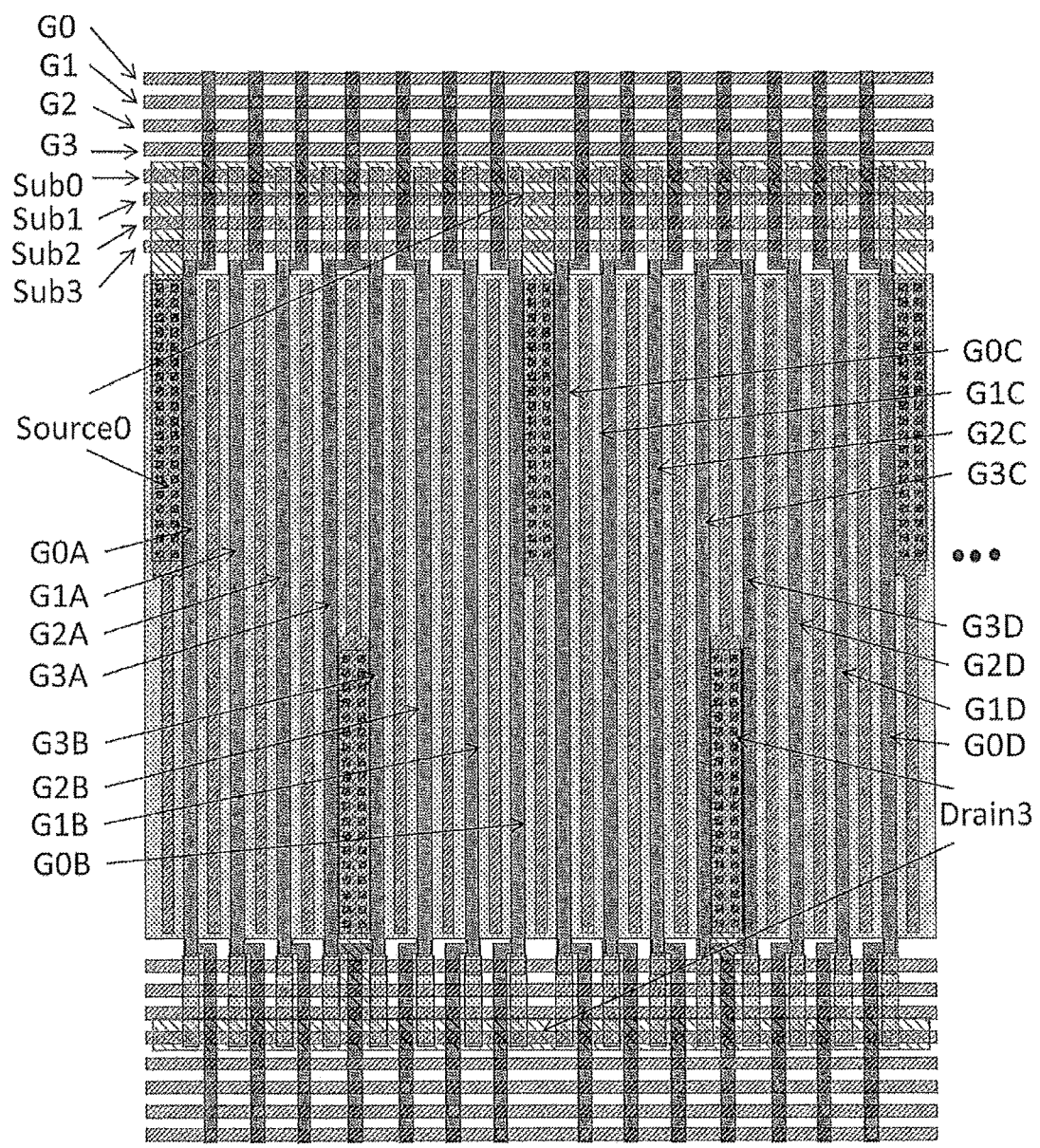
FIG. 32 is a plan view illustrating a configuration of a semiconductor device according to a tenth embodiment of the present disclosure.
Figure 33:
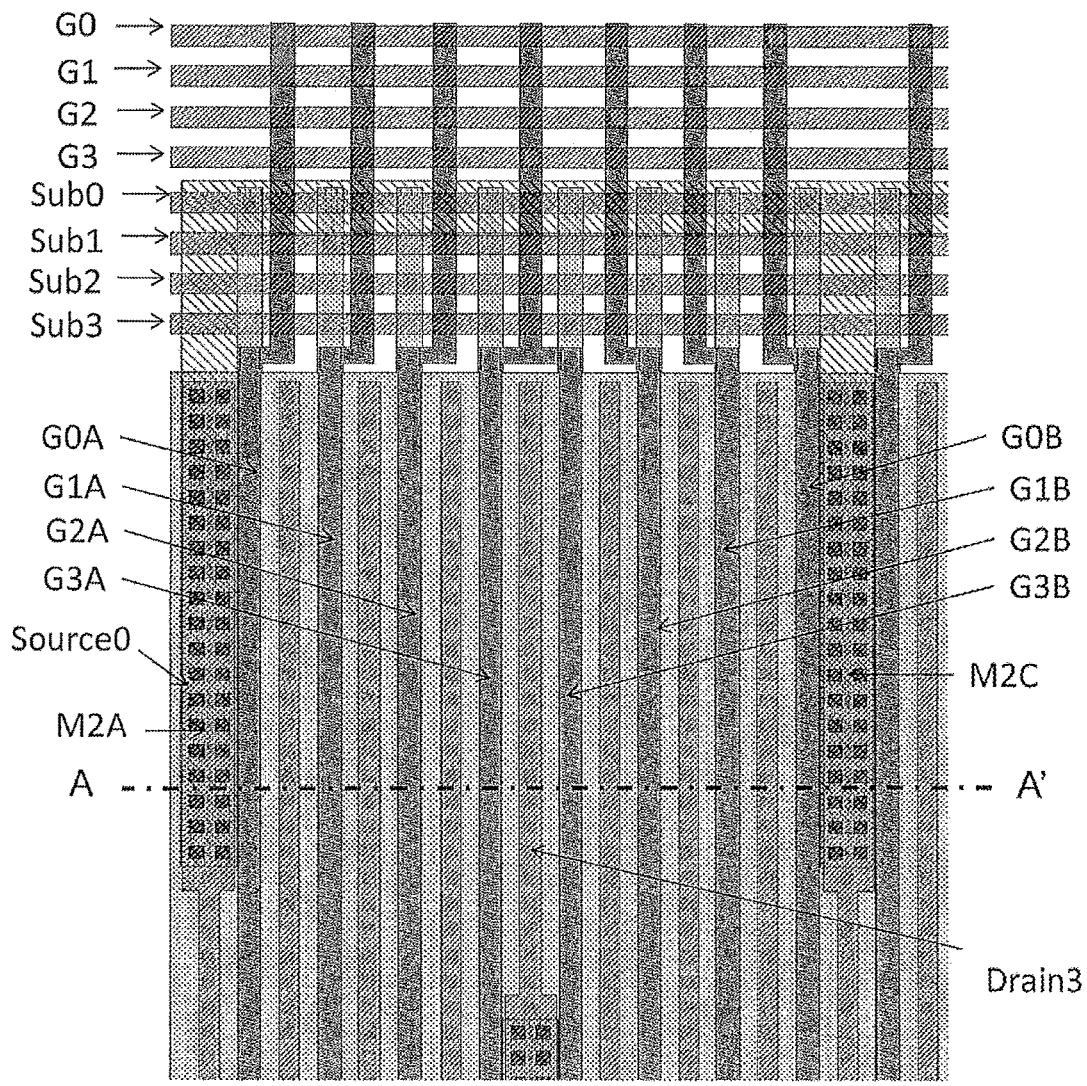
FIG. 33 is an enlarged plan view illustrating a configuration of a semiconductor device according to the tenth example of the present disclosure.
Figure 34:
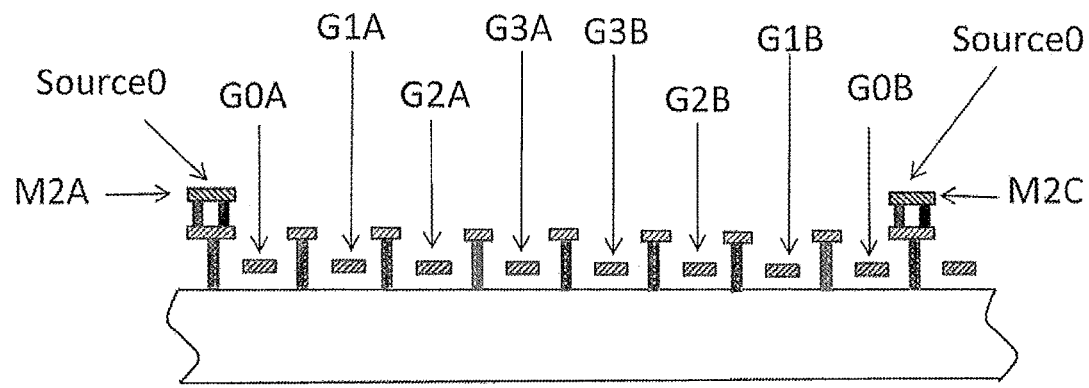
FIG. 34 is a cross-sectional view taken along the line A-A' of FIG. 33.

In this embodiment, as illustrated in FIG. 32, a configuration obtained by reducing the interconnect capacitance between Source 0 and Drain 3 in the configuration of the ninth embodiment described above is employed. FIG. 33 is an enlarged view of an upper left portion of FIG. 32. FIG. 34 is a cross-sectional view taken along the line A-A' of FIG.

33. As can be seen from the cross-sectional view, first, the gate electrodes G0A, G1A, G2A, G3A, G0B, G1B, G2B, and G3B of the transistors are arranged, a first interconnect layer (with no reference sign) is formed as an upper layer thereon, and furthermore, a second interconnect layer is formed as an upper layer thereon. However, in the cross-sectional view taken along the line A-A', only Source 0 (M2A) and Source 0 (M2C) are arranged from left in the cross-sectional view, and Drain 3 does not exist. Therefore, the interconnect capacitance between Source 0 and Drain 3 is largely reduced, and this configuration leads to increase in operation speed.

Eleventh Embodiment

Figure 35:
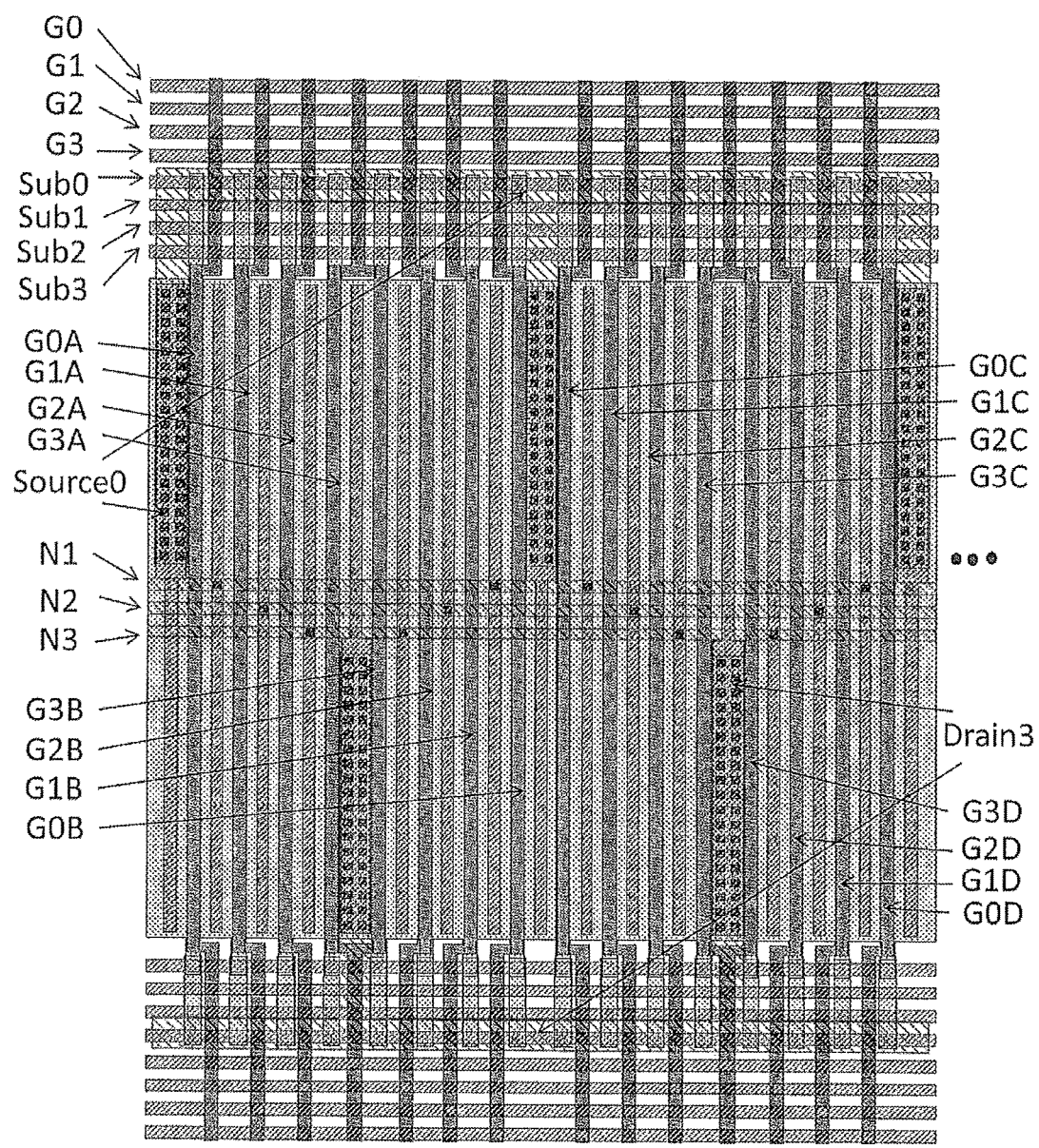
FIG. 35 is a plan view illustrating a configuration of a semiconductor device according to an eleventh embodiment of the present disclosure.
Figure 36:
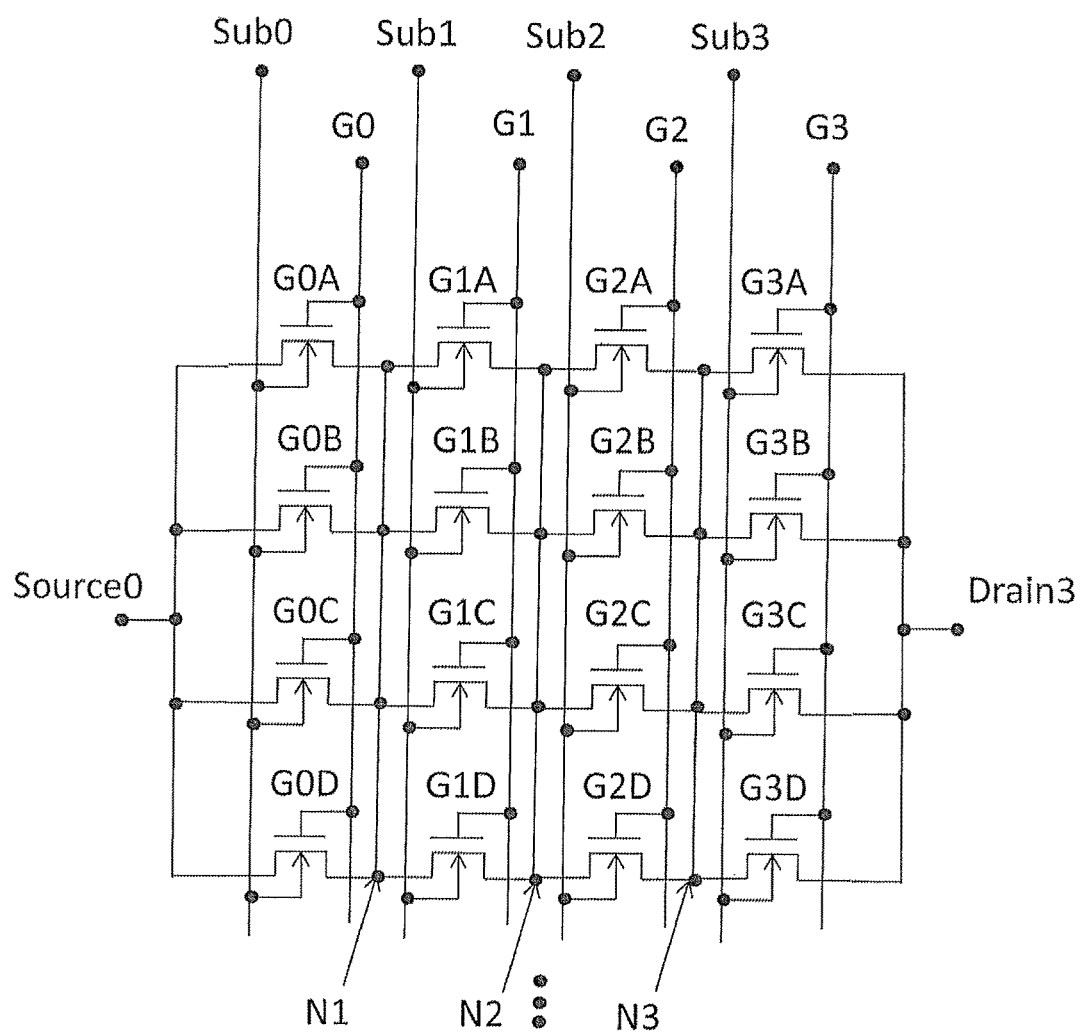
FIG. 36 is an equivalent circuit diagram of a semiconductor device according to the eleventh embodiment of the present disclosure.

In this embodiment, as illustrated in FIG. 35, a configuration in which, as for intermediate nodes of four transistors connected in series in one transistor group, the nodes between transistor groups are connected is employed. In FIG. 35, each of the reference signs N1, N2, and N3 denotes an interconnect to which a corresponding node is connected. An equivalent circuit of this embodiment is as illustrated in FIG. 36. According to this configuration, the nodes between the transistor groups are connected, and therefore, even when a situation in which, in each transistor group, an applied potential or the like differs due to transistor characteristics or variations in capacitance, the degree of influence can be advantageously lowered.

Twelfth Embodiment

Figure 37:
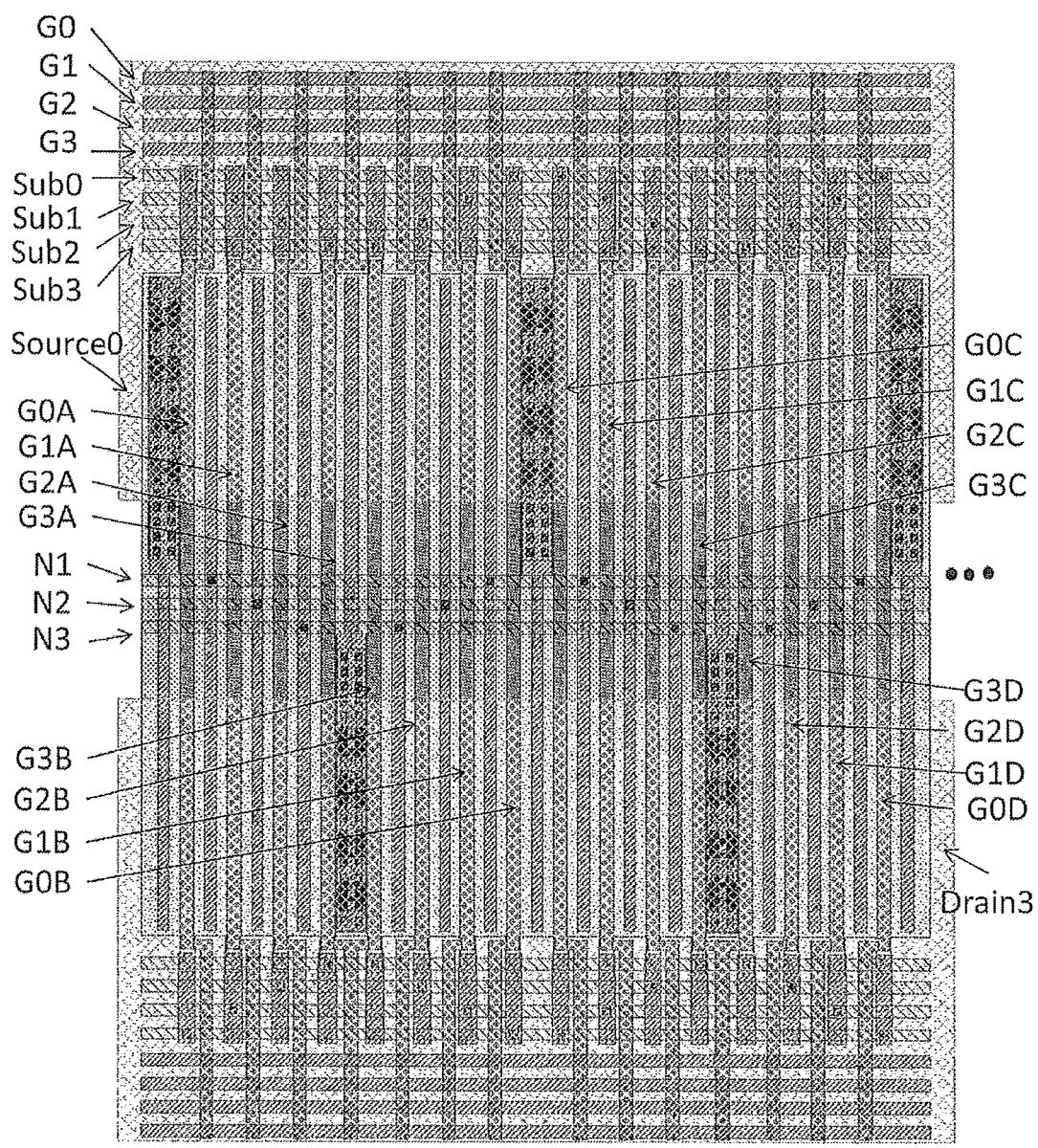
FIG. 37 is a plan view illustrating a configuration of a semiconductor device according to a twelfth embodiment of the present disclosure.
Figure 38:
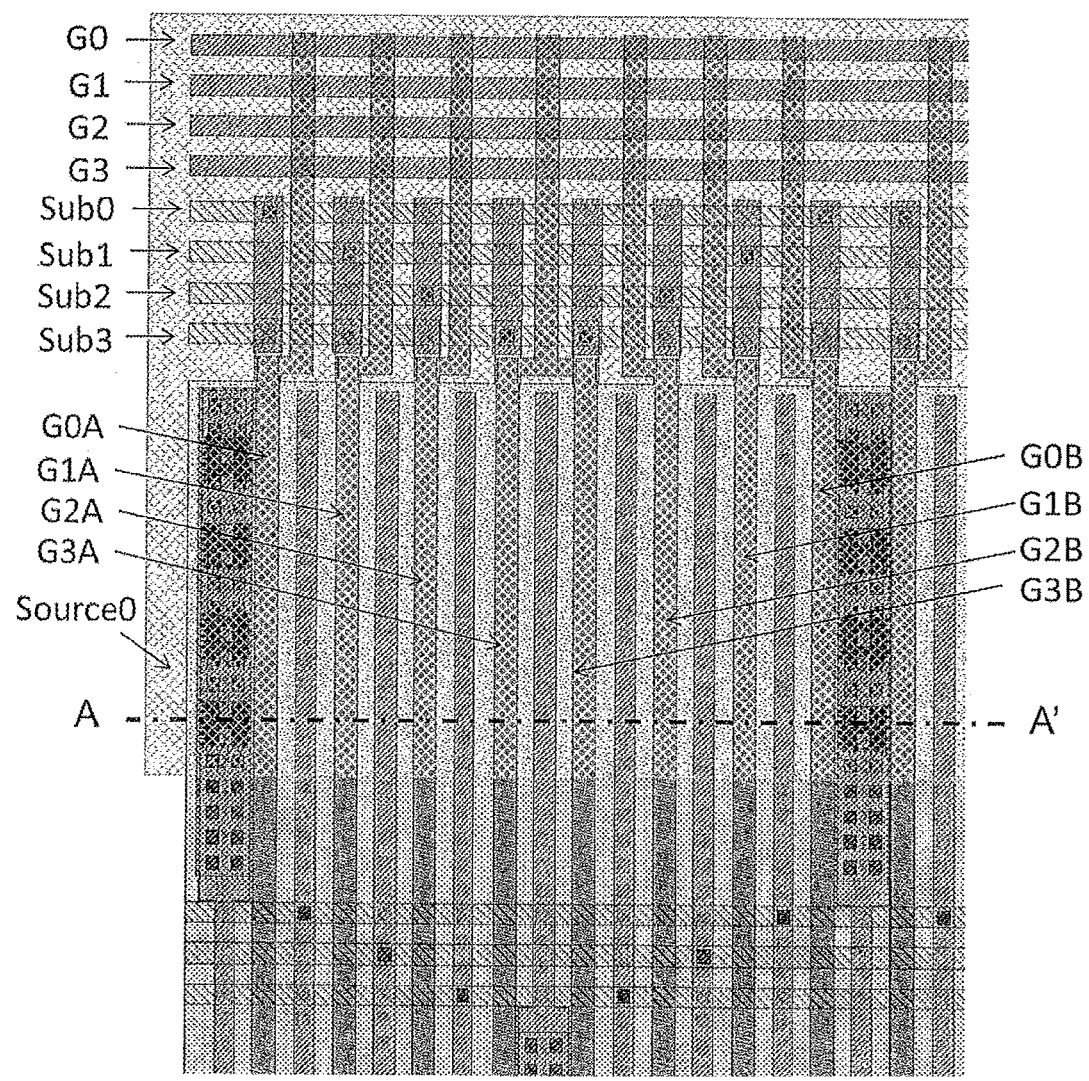
FIG. 38 is an enlarged plan view illustrating a configuration of a semiconductor device according to the twelfth embodiment of the present disclosure.
Figure 39:
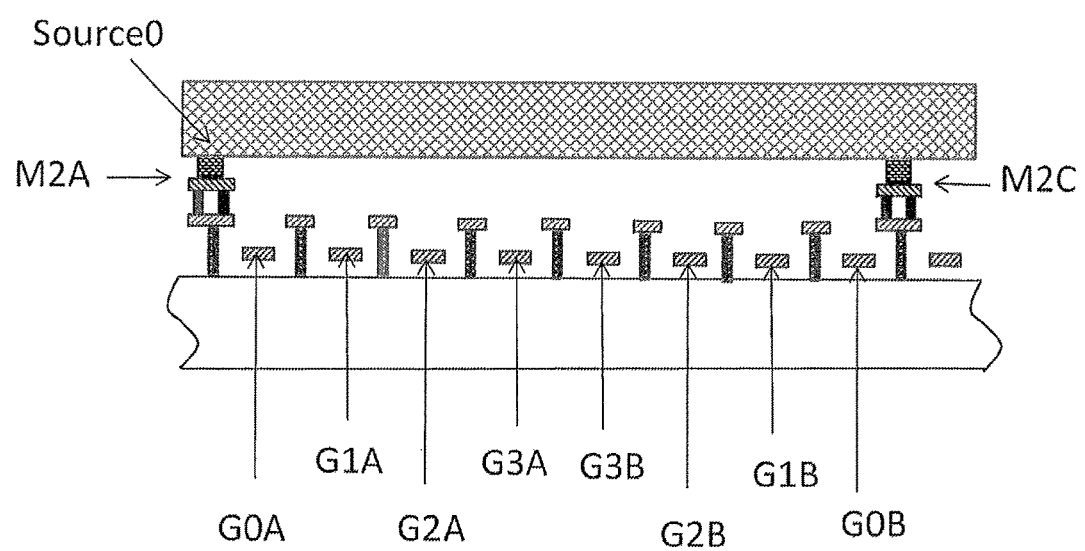
FIG. 39 is a cross-sectional view taken along the line A-A' of FIG. 38.

In this embodiment, as illustrated in FIG. 37, a configuration obtained by forming a third interconnect layer and thus reinforcing each of Source 0 and Drain 3 formed in the second interconnect layer to reduce resistance in the configuration of the eleventh embodiment is employed. FIG. 38 is an enlarged view of an upper left portion of FIG. 37. FIG. 39 is a cross-sectional view taken along the line A-A' of FIG. 38. As can be seen from the cross-sectional view, Source 0 (M2A) and Source 0 (M2C) are connected to each other via the third interconnect layer. Although not illustrated, in a cross section under the plane illustrated in FIG. 38, Drain 3 formed in the second interconnect layer is connected to the third interconnect layer. Since Source 0 and Drain 3 formed in the third interconnect layer are arranged with a space therebetween in a plane, a capacitance is small, and this configuration leads to increase in operation speed.

Thirteenth Embodiment

Figure 40:
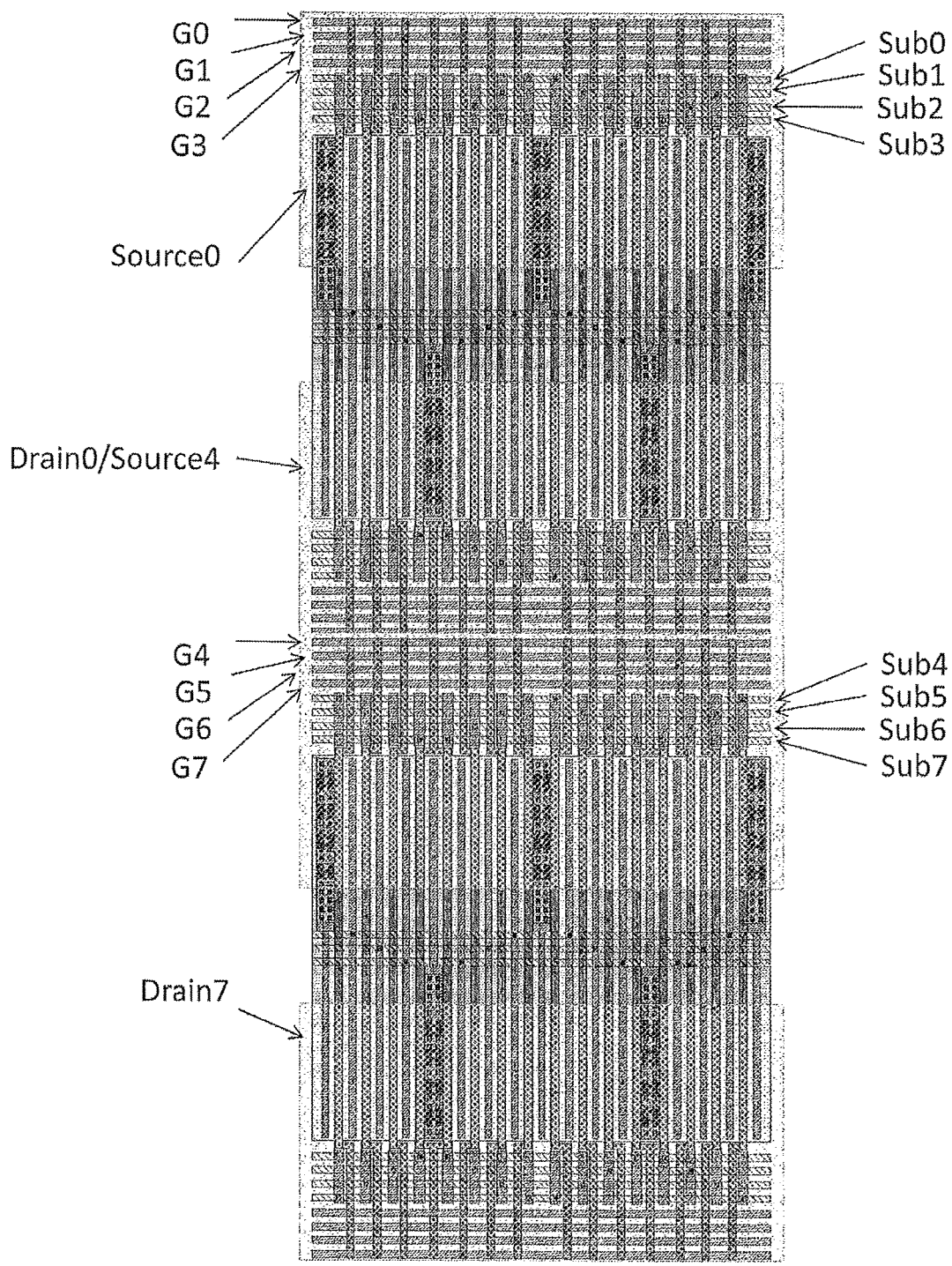
FIG. 40 is a plan view illustrating a configuration of a semiconductor device according to the twelfth embodiment of the present disclosure.
Figure 41:
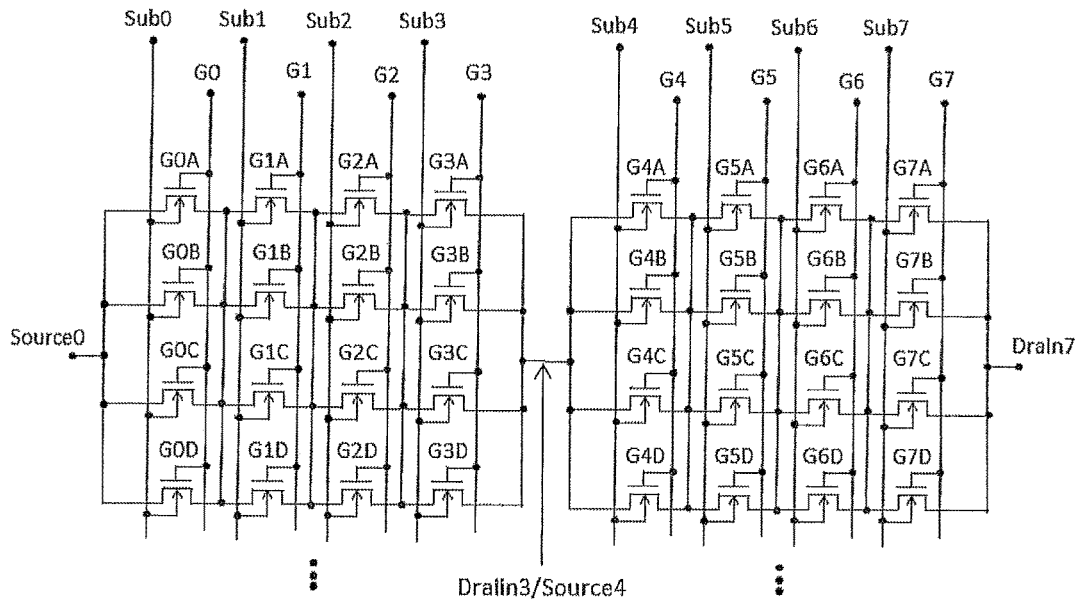
FIG. 41 is an equivalent circuit diagram of a semiconductor device according to the twelfth embodiment of the present disclosure.

In this embodiment, as illustrated in FIG. 40, two structures each of which has the configuration of the twelfth embodiment are connected, and thus, eight transistors as a whole are connected in series. An equivalent circuit of this embodiment is as illustrated in FIG. 41.

A capacitance between Source 0 and Drain 3 illustrated in FIG. 37 in the twelfth embodiment is a certain capacitance C, such as a capacitance in the third interconnect layer. In a case in which an eight-step series connection of transistors is employed, a configuration in which four-step series connections of transistors are made into an eight-step series connection is a possible option. In this case, the capacitance C is reduced by an amount of increase in a distance between Source 0 and Drain 3 in the first interconnect but, for example, the capacitance in the third interconnect having a large thickness is reduced by only a small amount. Therefore, the capacitance C is not reduced and the distance between Source 0 and Drain 3 in the third interconnect layer is increased, so that, for example, a capacitance C2 that is about twice the capacitance C1 exits accordingly. In contrast, in a configuration in which two four-step series connections are connected, the entire capacitance is capacitances connected in series, and thus, is ½*C. Therefore, for multiple-step connections, when importance is placed also on reduction in the entire capacitance, a combined configuration obtained by combining the configurations described in the ninth to twelfth embodiments and a configuration in which these configurations are connected in series is preferable in some cases. A configuration in which a further reduced capacitance exists can be achieved by properly selecting a suitable configuration in designing.

The preferred embodiments of the present disclosure have been described above. However, the description herein is not limiting the present disclosure, but needless to say, various modifications can be made. For example, in the above described embodiments, examples in which transistors are formed on an SOI substrate have been described, but the present disclosure is not limited thereto. Transistors may be formed on a general silicon substrate.

Figure 42:
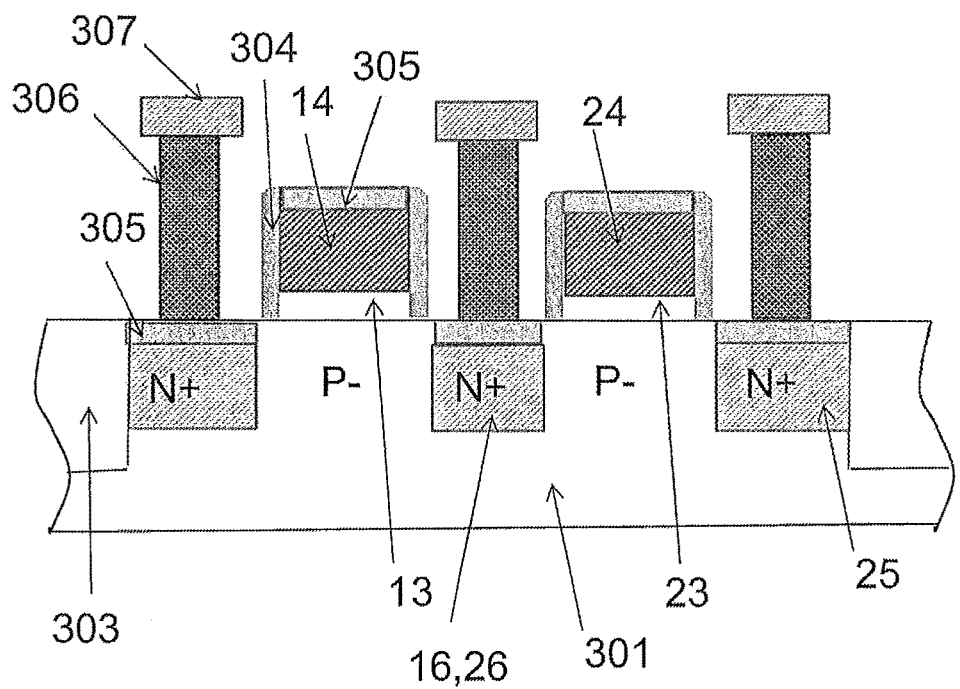
FIG. 42 is a cross-sectional view illustrating a configuration of a semiconductor device according to another embodiment of the present disclosure.
Figure 43:
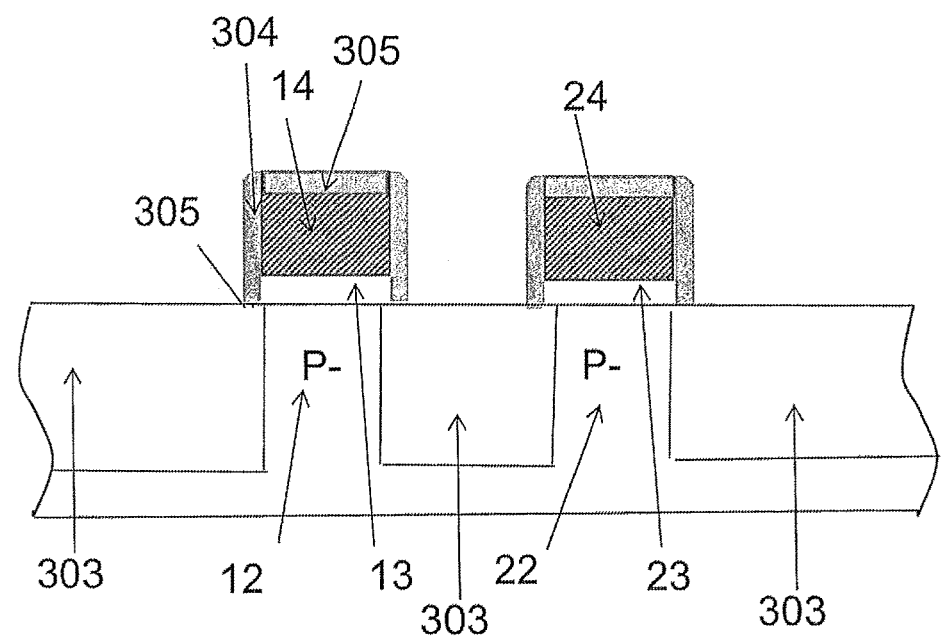
FIG. 43 is a cross-sectional view illustrating a configuration of a semiconductor device according to another embodiment of the present disclosure.
Figure 44:
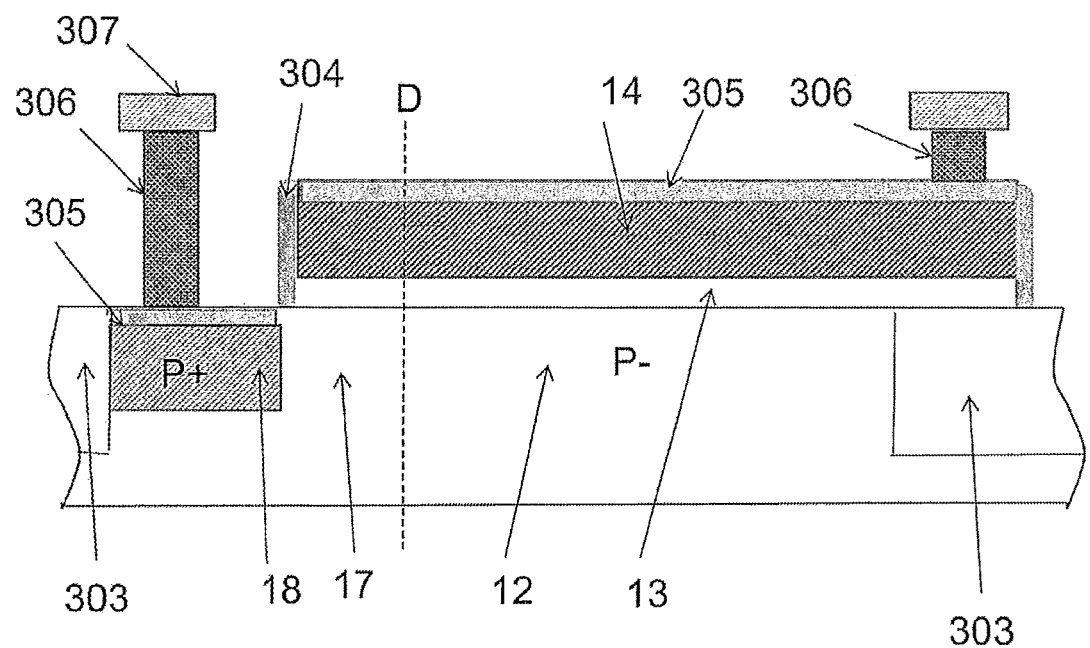
FIG. 44 is a cross-sectional view illustrating a configuration of a semiconductor device according to another embodiment of the present disclosure.
Figure 45:
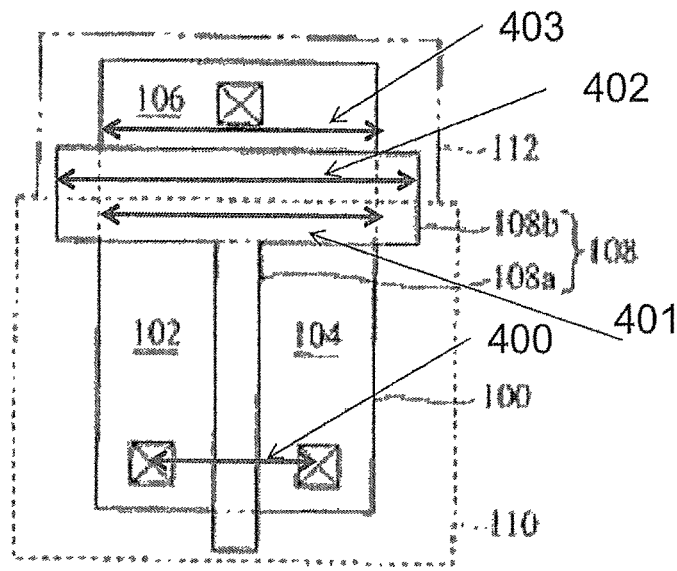
FIG. 45 is a plan view illustrating a configuration of a known semiconductor device.
Figure 46:
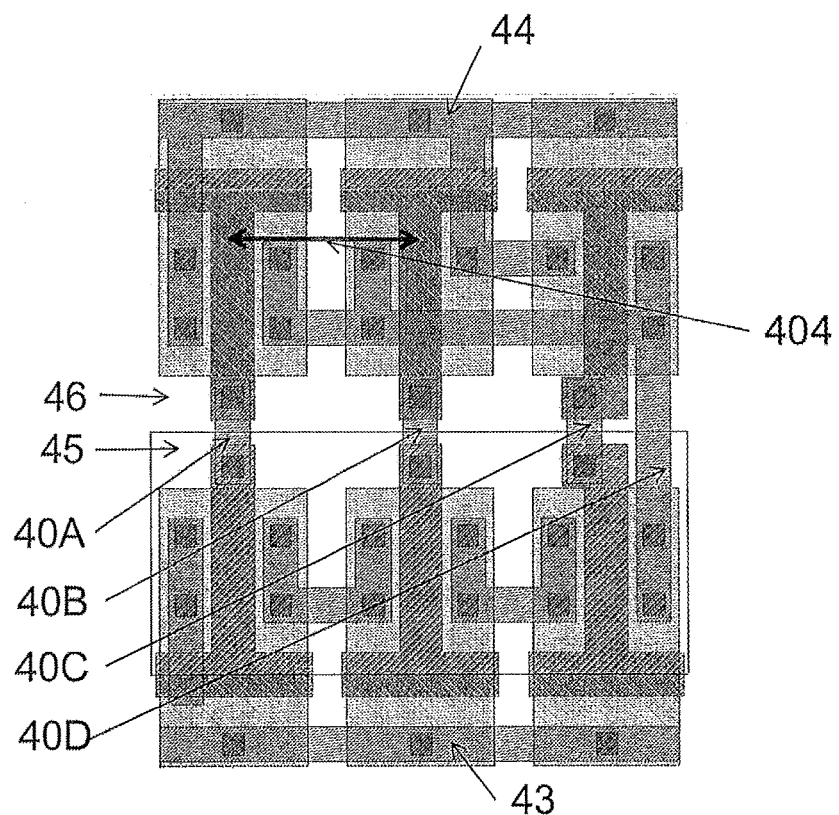
FIG. 46 is a plan view illustrating an application example of a known semiconductor device.
Figure 47:
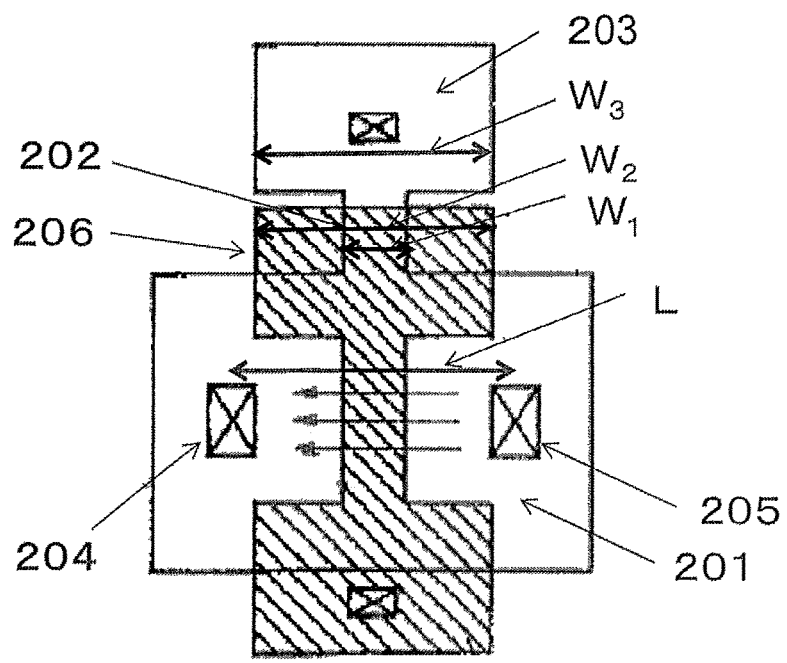
FIG. 47 is a plan view illustrating a configuration of a known semiconductor device.

In this case, a plan view of a semiconductor device according to the present disclosure is the same as that of the configuration illustrated in FIG. 1. Cross-sectional views taken along the line A-A', the line B-B', and the line C-C' of FIG. 1 are as illustrated in FIG. 42 to FIG. 44.

The element isolation film 303 that defines the active region 1 is formed on the P$^-$ silicon substate 301, and the gate electrodes 14 and 24 are formed in the active region 1 via the gate insulation films 13 and 23. The channel regions 12 and 22 of the first transistor 11 and the second transistor 21 are formed of a P$^-$ silicon substate (or a P$^-$ well region formed in a silicon substate), and the source regions 15 and 25 and the drain regions 16 and 26 are formed of an N$^+$ diffusion layer. The lead portions 17 and 27 are formed of the P$^-$ silicon substate (or a P$^-$ well region formed in a silicon substate), and the connection portions 18 and 28 are formed of a P$^+$ diffusion layer.

What is claimed is:
1. A semiconductor device comprising:
a first transistor; and
a second transistor,
the first transistor and the second transistor being formed in a same active region defined by an element isolation region,
wherein
the active region includes a body region in which the first transistor and the second transistor are formed, a connection portion to which a potential of the body region is connected, and a lead portion that connects the body region and the connection portion,
each of the first transistor and the second transistor formed in the body region includes a channel region, a gate electrode formed on the channel region via a gate insulation film, and a source region and a drain region formed with the channel region interposed therebetween,
the source regions or the drain regions of the first transistor and the second transistor are formed in a common region and have a same potential,
in each of the first transistor and the second transistor, the channel region, the connection portion, and the lead portion have the same conductivity type,
each of the lead portions extends from a corresponding one of the channel regions of the first transistor and the second transistor in a direction perpendicular to a channel direction such that the lead portions are isolated from each other, and each of the gate electrodes extends on a corresponding one of the lead portions,
a width of each of the lead portions is narrower than a distance between corresponding ones of contact portions of the source regions and the drain regions of the first transistor and the second transistor, and
a width of each of the connection portions is equal to or narrower than a gate width of a corresponding one of the gate electrodes extending on the lead portions.

2. The semiconductor device of claim 1, wherein
the gate width of each of the gate electrodes extending on the lead portions is equal to or narrower than a width enlarged by an amount corresponding to a width of mask displacement width of the gate electrode with respect to the corresponding lead portion.

3. The semiconductor device of claim 1, wherein
the width of the connection portions and the width of the lead portions are same.

4. The semiconductor device of claim 1, wherein
each of the lead portions of the first transistor and the second transistor extends from a corresponding one of the channel regions in a same direction.

5. The semiconductor device of claim 1, wherein
the active region is formed of a semiconductor layer on an insulation layer formed on a substrate.

6. The semiconductor device of claim 1, wherein
the first transistor and the second transistor are formed of transistors of a same channel type.

7. The semiconductor device of claim 1, wherein
the width of the gate electrodes formed on the channel regions and the width of the gate electrodes extending on the lead portions are same.

8. The semiconductor device of claim 1, wherein
the active region further includes a second body region in which a third transistor is formed, a second connection portion to which a potential of the second body region is connected, and a second lead portion that connects the second body region and the second connection portion,
the second lead portion extends from the channel region of the third transistor in an opposite direction to the lead portion of the first transistor or the second transistor, and
the second connection portion is formed with the connection portion of the first transistor or the second transistor in a common region and the second connection portion and the connection portion have a same potential.

9. The semiconductor device of claim 1, wherein
in each of the channel regions of the first transistor and the second transistors, a third lead portion extends from an opposite side to a side from which the lead portions extend, and
the gate electrodes extending on the lead portions and the gate electrode extending on the third lead portion have a same shape.

10. The semiconductor device of claim 9, wherein
a third connection portion to which the potential of the body region is connected is further connected to the third lead portion.

11. The semiconductor device of claim 1, wherein
when the width of the gate electrodes formed on the channel regions and the width of the gate electrodes extending on the lead portions are different and a boundary between each of the gate electrodes formed on the channel regions and a corresponding one of the gate electrode extending on the lead portions is positioned in an outer side than a boundary of the body region in which the first transistor and the second transistor are formed, the gate electrodes formed on the channel regions are perpendicular to the boundary of the body region.

12. The semiconductor device of claim 1, wherein
when the width of the gate electrodes formed on the channel regions and the width of the gate electrodes extending on the lead portions are different and a boundary between each of the gate electrodes formed on the channel regions and a corresponding one of the gate electrodes extending on the lead portions is positioned in an inner side than a boundary of the body region in which the first transistor and the second transistor are formed, a boundary of each of the gate electrodes formed on the channel regions and a corresponding one of the gate electrodes extending on the lead portions is tilted by an angle of 135 degrees or more.

13. The semiconductor device of claim 1, wherein
a first transistor group formed in the active region includes a source region and a drain region and is configured such that transistors including the first transistor connected to a first gate and the second transistor connected to a second gate between the source region and the drain region are connected in series from a source region side.

14. The semiconductor device of claim 1, wherein
a first transistor group formed in the active region includes a source region and a drain region and is configured such that transistors including the first transistor connected to a first gate and the second transistor connected to a second gate between the source region and the drain region are connected in series from a source region side, and
a second transistor group formed in the active region includes a source region that shares a same node with the source region and a drain region that shares a same node with the drain region and is configured such that transistors including a third transistor connected to the first gate and a fourth transistor connected to the second gate between the source region and the drain region are connected in series from a source region side.

15. A semiconductor device,
wherein
a first transistor group formed in an active region includes a source region and a drain region and is configured such that transistors including a first transistor connected to a first gate and a second transistor connected to a second gate between the source region and the drain region are connected in series from a source region side,
in each of the first transistor and the second transistor, the channel region, the connection portion, and the lead portion have the same conductivity type, and
each of respective channel potentials of the first transistor and the second transistor is led out from an active region of a lower layer of the gates.

16. A semiconductor device,
wherein
a first transistor group formed in an active region includes a source region and a drain region and is configured such that transistors including a first transistor connected to a first gate and a second transistor connected to a second gate between the source region and the drain region are connected in series from a source region side, in each of the first transistor and the second transistor, the channel region, the connection portion, and the lead portion have the same conductivity type, and a second transistor group formed in the active region includes a source region that shares a same node with the source region and a drain region that shares a same node with the drain region and is configured such that transistors including a third transistor connected to the first gate and a fourth transistor connected to the second gate between the source region and the drain region are connected in series from a source region side, and each of respective channel potentials of the first transistor and the second transistor is led out from an active region of a lower layer of the gates.

* * * * *